(12) United States Patent
Chan et al.

(10) Patent No.: US 7,667,526 B2
(45) Date of Patent: Feb. 23, 2010

(54) APPARATUS, SYSTEM, AND METHOD FOR MULTIFUNCTIONAL PIN IN AN INTEGRATED CIRCUIT

(75) Inventors: Tuck Meng Chan, Singapore (SG); Xiao Wu Gong, Singapore (SG); Yi He, Singapore (SG); Meng Kiat Jeoh, Singapore (SG); Junyang Luo, Singapore (SG)

(73) Assignee: Infineon Technologies Austria AG, Villach (AT)

( * ) Notice: Subject to any disclaimer, the term of this patent is extended or adjusted under 35 U.S.C. 154(b) by 215 days.

(21) Appl. No.: 11/461,303

(22) Filed: Jul. 31, 2006

(65) Prior Publication Data

US 2008/0024193 A1   Jan. 31, 2008

(51) Int. Cl.
*H03K 17/687* (2006.01)
(52) U.S. Cl. ........................ 327/427; 327/430
(58) Field of Classification Search ................ 327/419, 327/427, 430, 431, 434, 437
See application file for complete search history.

(56) References Cited

U.S. PATENT DOCUMENTS

| | | | |
|---|---|---|---|
| 6,608,552 B1 * | 8/2003 | Fogel et al. | 340/310.11 |
| 7,136,292 B1 * | 11/2006 | Chan et al. | 363/21.09 |
| 7,176,744 B2 * | 2/2007 | Goudo | 327/434 |
| 2006/0227082 A1 * | 10/2006 | Ogata et al. | 345/76 |
| 2007/0279112 A1 * | 12/2007 | Maeda et al. | 327/158 |

* cited by examiner

*Primary Examiner*—Lincoln Donovan
*Assistant Examiner*—Diana J Cheng
(74) *Attorney, Agent, or Firm*—Schwegman Lundberg & Woessner, P.A.

(57) ABSTRACT

Some embodiments of the invention include an integrated circuit having a node or pin to detect a first information during a first a detection period and to detect a second information during a second detection period. In some embodiments, the information at the pin may allow the integrated circuit to operate in a quasi-resonant operation. Other embodiments are described and claimed.

29 Claims, 14 Drawing Sheets

| $V_{ZC-ON}$ | <V1 | V1 TO V2 | >V2 |
|---|---|---|---|
| $V_{ZC-OFF}$ | V3 | V3 | V3 |
| $F_B$ | $F_{B1}$ | $F_{B2}$ | $F_{B3}$ |
| $V_{FBC}$ | $V_{FBC1}$ | $V_{FBC2}$ | $V_{FBC3}$ |
| $I_{ZC}$ | I1 | I1 | I1 |

__ US 7,667,526 B2 __

APPARATUS, SYSTEM, AND METHOD FOR MULTIFUNCTIONAL PIN IN AN INTEGRATED CIRCUIT

FIELD

Embodiments of the present invention relate generally to power supplies for electrical devices or systems, and particularly to switch mode power supplies.

BACKGROUND

Electrical devices or systems need power from a power source to operate. In situations where the characteristics of the power source are incompatible with the characteristics of the power needed by the systems, a controller or converter may be used to manipulate the power source to provide a suitable power for the systems. The controller is usually formed in an integrated circuit (IC) or IC chip.

A switch mode power supply (SMPS) is an arrangement of electrical components, including the IC controller, to provide suitable power to a system. A typical IC usually includes external pins for electrical communication with other components. In an SMPS, the IC may include pins for providing specific functions in the SMPS.

In some cases, new functions for the SMPS may be needed. Existing pins of the IC controller may be unable to carry both existing functions and the new functions. Therefore, to accommodate the new functions, new pins may be added to the IC. However, for some ICs, adding new pins may increase size, cost, or both.

DESCRIPTION OF THE DRAWINGS

Figure 1:
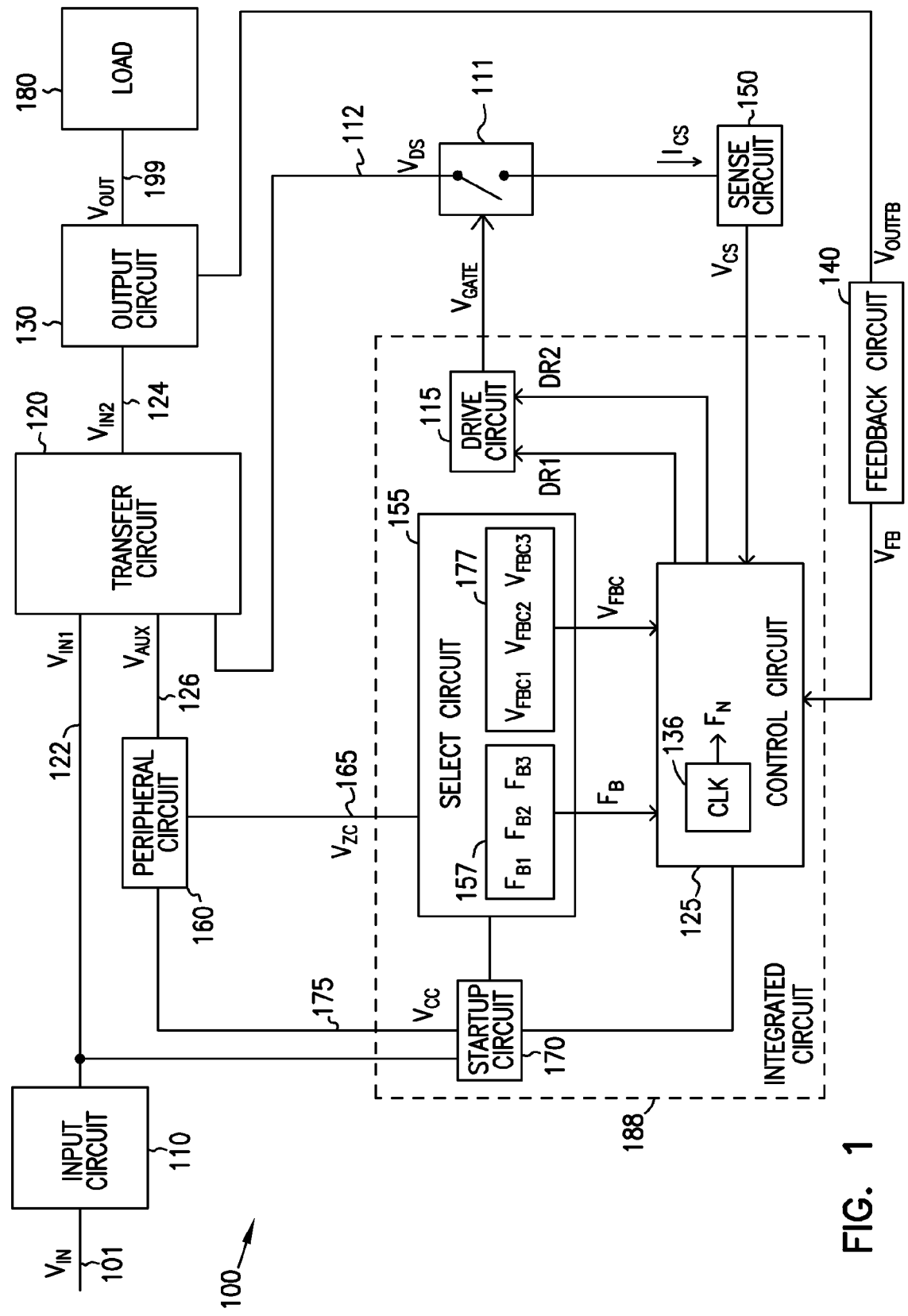
FIG. 1 shows an apparatus according to an embodiment of the invention.

FIG. 1 shows an apparatus 100 according to an embodiment of the invention. Apparatus 100 converts an input voltage signal $V_{IN}$ received at a node (line) 101 and provides an output voltage signal $V_{OUT}$ at a node 199. A load 180 uses $V_{OUT}$ as its supply power. Some or all components of apparatus 100 may be used for or included in electrical devices or systems. For example, in some embodiments, apparatus 100 may be used in a SMPS. In some embodiments, apparatus 100 may operate in an operation commonly known as a quasi-resonance operation or quasi-resonance flyback operation. In other embodiments, apparatus 100 may operate without the quasi-resonance operation.

In FIG. 1, an input circuit 110 receives $V_{IN}$ and provides a voltage signal $V_{IN1}$ at a node 122. A transfer circuit 120 receives $V_{IN1}$ and provides a voltage signal $V_{AUX}$ at a node 126 and a voltage signal $V_{IN2}$ at a node 124. A peripheral circuit 160 receives $V_{AUX}$ and provides a supply voltage $V_{CC}$ at a node 175. An output circuit 130 receives $V_{IN2}$ and provides $V_{OUT}$ to load 180. In some embodiments, load 180 may include a system such as a television, a digital versatile disc (DVD) system, or a computer. Thus, in some embodiments, load 180 may include a monitor. The monitor may include a cathode ray tube (CRT).

In some embodiments, $V_{IN}$ may be an AC (alternating current) voltage and $V_{OUT}$ may be a DC (direct current) voltage. In embodiments where $V_{IN}$ is an AC voltage, input circuit 110 may include AC to DC conversion circuitry, e.g., rectifier circuitry, to convert an AC voltage into a DC voltage.

In some embodiments, transfer circuit 120 may include at least one transformer, such that each of $V_{AUX}$ and $V_{IN2}$ may be proportional to $V_{IN1}$ based on the ratio of windings of the transformer. In embodiments where transfer circuit 120 includes a transformer, node 122 may be on a first end of a first winding on the primary side of the transformer, and node 112 may be on a second end of the first winding. $V_{AUX}$ may be provided by an auxiliary winding on the primary side of the transformer. $V_{IN2}$ may be provided by a winding on the secondary side of the transformer.

Output circuit 130 may include at least one diode, at least one capacitor, or a combination of these circuit components to reduce signal variation in $V_{IN2}$. For example, output circuit 130 may include filter circuitry to smooth the signal of $V_{IN2}$.

Apparatus 100 may have a startup mode, a normal mode, and a burst mode. In the startup mode, a startup circuit 170 may receive $V_{IN1}$ from node 122 to supply a starting voltage for the initialization of at least some of the components of apparatus 100 when $V_{IN}$ is applied to node 101 at a first time. FIG. 1 shows an example where startup circuit 170 $V_{IN1}$ from node 122 during the startup mode. In some embodiments, startup circuit 170 may receive $V_{DS}$ from node 112 (instead of $V_{IN1}$) during the startup mode. In some embodiments, after a first startup mode, apparatus 100 may also turn itself off and then on again in a second startup mode, when an event such as overload, overheat, or over-voltage occurs. In the normal mode, apparatus 100 may control the transfer of power from node 122 to node 124 based on the condition at load 180, so that power may appropriately transferred to load 180. In the burst mode, apparatus 100 may reduce the number of times (frequency) that power is transferred from node 122 to node 124 to save power. In some embodiments, the power consumption of apparatus 100 (e.g., at load 180) in the burst mode may be less than that in the normal mode.

Apparatus 100 switches (turns on and turns off) a switch 111 to control the transfer of power from node 122 to node 124. Depending on the condition at load 180, apparatus 100 may switch the switch 111 at different switching frequencies. For example, apparatus 100 may switch the switch 111 at a first switching frequency in the normal mode and at a second switching frequency in the burst mode. In the description herein, the switching frequency in the normal mode may be called the normal switching frequency; the switching frequency in the burst mode may be called the burst switching frequency.

In some embodiments, the normal switching frequency depends on the condition at load 180. Thus, the normal switching frequency may be a variable frequency based on load conditions. In some embodiment, during the burst mode, the burst switching frequency may be a fixed frequency. In FIG. 1, the burst switching frequency may be selected from multiple selectable burst switching frequencies, as described in more detail below.

A control circuit 125 monitors a feedback signal $V_{FB}$ to determine the condition at load 180 so that apparatus 100 may decide which mode (normal mode or burst mode) apparatus 100 should be in. In some embodiments, the condition at load 180 is based on the amount of power consumed by load 180. For example, load 180 may consume a large amount of power at one time and a small or minimal amount of power at another time. The power consumed by load 180 is derived from $V_{OUT}$. Output circuit 130 also provides a voltage signal $V_{OUTFB}$ based on $V_{OUT}$.

A feedback circuit 140 provides $V_{FB}$ based on $V_{OUTFB}$. In some embodiments, feedback circuit 140 may include optocoupler circuitry (optical-isolator) to provide $V_{FB}$ such that $V_{FB}$ is related to $V_{OUTFB}$ and $V_{OUT}$. By monitoring the value of $V_{FB}$, the value of $V_{OUT}$ may also be monitored. Thus, by monitoring $V_{FB}$, apparatus 100 may determine the condition at load 180 to appropriately control the transfer of power to node 124. For example, when apparatus 100 determines (e.g., based on monitoring $V_{FB}$) that load 180 may use a larger amount of power, apparatus 100 may switch to or maintain the normal mode to appropriately control the switching of switch 111 to provide an appropriate power to load 180. For another example, when apparatus 100 determines (e.g., based on monitoring $V_{FB}$) that load 180 may use a smaller amount of power, apparatus 100 may switch to maintain the burst mode to appropriately control the switching of switch 111 to provide an appropriate power to load 180.

A drive circuit 115 uses a gate signal $V_{GATE}$ to switch the switch 111. The switching frequency of switch 111 is based on the frequency of $V_{GATE}$. Apparatus 100 is configured such that $V_{GATE}$ has one frequency in the normal mode and another frequency in the burst mode. The frequency of $V_{GATE}$ is affected by drive signals DR1 and DR2.

A control circuit 125 provides drive signals DR1 and DR2. In some embodiments, DR1 may determine the frequency of $V_{GATE}$, and DR2 may determine the duty cycle of $V_{GATE}$. Control circuit 125 may set the frequency of DR1 corresponding to the frequency of a clock signal $F_N$, provided by a generator (CLK) 136, in the normal mode. Control circuit 125 may set the frequency of DR1 corresponding to the frequency of a burst switching frequency signal $F_B$ in the burst mode. Control circuit 125 may monitor $V_{FB}$ to determine which of the normal mode or burst mode to be in so that DR1 may be appropriately set. Control circuit 125 may set the duty cycle of $V_{GATE}$ through DR2. The duty cycle of $V_{GATE}$ may include an on-time (e.g., when $V_{GATE}$ is high) and an off-time (e.g., when $V_{GATE}$ is low). Switch 111 may also have an on-time corresponding to the on-time of $V_{GATE}$, and an off-time corresponding to the off-time of $V_{GATE}$. Switch 111 may be turned on during the on-time and turned off during the off-time. Since switch 111 is controlled by $V_{GATE}$, setting the duty cycle or on-time of $V_{GATE}$ may control the on-time of switch 111 during each cycle of $V_{GATE}$. By controlling the on-time of switch 111, the maximum output power level to node 199 may be controlled. Controlling the maximum output power level at node 199 may protect apparatus 100 from damage when the voltage varies (e.g., increases in voltage). Control circuit 125 may set the duty cycle of $V_{GATE}$ to control the maximum output power level based on a sense signal $V_{CS}$ and a foldback correction curve signal $V_{FBC}$. A sense circuit 150 provides $V_{CS}$. $V_{CS}$ depends on amount of current $I_{CS}$ flowing through switch 111. $I_{CS}$ may indicate the amount of power at node 199. By sensing $V_{CS}$ the maximum output power level may be set to an appropriate level.

As described above, control circuit 125 may use $F_N$ to cause drive circuit 115 to switch the switch 111 at the normal switching frequency during the normal mode, and may use $F_B$ to cause drive circuit 115 to switch the switch 111 at the burst switching frequency during the burst mode.

A select circuit 155 includes a generator 157 to generate multiple selectable signals $F_{B1}$, $F_{B2}$, and $F_{B3}$, and a generator 177 to generate multiple selectable signals $V_{FBC1}$, $V_{FBC2}$, and $V_{FBC3}$. Select circuit 155 selects from among the signals $F_{B1}$, $F_{B2}$, and $F_{B3}$ to provide $F_B$, and from among the signals $V_{FBC1}$, $V_{FBC2}$, and $V_{FBC3}$ to provide $V_{FBC}$. Thus, in FIG. 1, $F_B$ is one of the signals $F_{B1}$, $F_{B2}$, and $F_{B3}$. $V_{FBC}$ is one of the signals $V_{FBC1}$, $V_{FBC2}$, and $V_{FBC3}$. $F_{B1}$, $F_{B2}$, and $F_{B3}$ have different frequencies or multiple frequencies. The multiple selectable burst switching frequencies of apparatus 100 correspond to the multiple frequencies of $F_{B1}$, $F_{B2}$, and $F_{B3}$. As described above, $F_B$ may affect the frequency of $V_{GATE}$ during the burst mode, and $V_{FBC}$ and $V_{CS}$ may affect the on-time and off-time in each cycle of $V_{GATE}$. Thus, by selecting among $F_{B1}$, $F_{B2}$, and $F_{B3}$, different burst switching frequencies for apparatus 100 may be selected. By selecting among $V_{FBC1}$, $V_{FBC2}$, and $V_{FBC3}$, different foldback correction curves for apparatus 100 may be selected to set the maximum output power level at an appropriate level.

As is known in the art, an operation such as a quasi-resonant flyback operation may include a function that is commonly known as a foldback correction function to maintain a constant maximum output power level capability versus various input voltages. However, some conventional devices or systems may have only a single or a fixed foldback correction. The fixed foldback correction in some conventional devices or systems may be used in a relatively small range of applications and may be unsuitable for other applications. In apparatus 100, however, since multiple foldback corrections (corresponding to $V_{FBC1}$, $V_{FBC2}$, and $V_{FBC3}$) are available, apparatus 100 may be suitable for a wider range of applications in comparison to the fixed foldback correction of some conventional devices or systems.

In apparatus 100, node 165 may be used to provide information to allow apparatus 100 to select both $F_B$ and $V_{FBC}$. The information at node 165 is presented by a voltage signal $V_{ZC}$. By providing different values for $V_{ZC}$, different burst switching frequencies (one of $F_{B1}$, $F_{B2}$, and $F_{B3}$) and different foldback correction curves (one of $V_{FBC1}$, $V_{FBC2}$, and $V_{FBC3}$) may be selected. In some embodiments, peripheral circuit 160 may be configured to provide different values for $V_{ZC}$ based on the values of circuit components in peripheral circuit 160. For example, peripheral circuit 160 may include resistors such that different values for $V_{ZC}$ may be selected by choosing different values for the resistors. In some embodiments, for the function of selecting $F_B$ and $V_{FBC}$, apparatus 100 may detect the value of $V_{ZC}$ provided to node 165 during the on-time of switch 111.

Node 165 may also be used for detecting the zero crossing for the quasi-resonant operation. In the quasi-resonant operation, apparatus 100 may detect a voltage value of $V_{DS}$ at node 112 to control the switching of switch 111. $V_{DS}$ is related to $V_{AUX}$. $V_{ZC}$ is dependent on $V_{AUX}$. Thus, apparatus 100 may detect the value of $V_{DS}$ by detecting the value of $V_{ZC}$ at node 165. In some embodiments, for the quasi-resonant operation, apparatus 100 may detect a specific value of $V_{DS}$ during the off-time of switch 111 in which the specific value may be a relatively small value in comparison to a maximum value of $V_{DS}$. For example, the specific value of $V_{DS}$ may be substantially zero. In some embodiments, the specific value of $V_{DS}$ may be the minimum value of $V_{DS}$. In some embodiments, switch 111 may include a transistor such that the minimum value of $V_{DS}$ corresponds to the minimum value of drain-to-source voltage of the transistor when the transistor is turned off. The value of $V_{DS}$ that apparatus 100 detects for the quasi-resonant operation may be commonly called the zero crossing of $V_{DS}$. In some embodiments, for the zero crossing detection function, apparatus 100 may detect the value of $V_{ZC}$ provided to node 165 during the off-time of switch 111.

Node 165 may also be used for output over-voltage protection for apparatus 100. In some embodiments, control circuit 125 may be configured to protect apparatus 100 from an event such as an output over-voltage. For example, control circuit 125 may detect and compare the value of $V_{ZC}$ at node 165 with a protection value such that control circuit 125 may turn off switch 111 when $V_{ZC}$ exceeds the protection value to protect apparatus 100 from damage due to output over-voltage protection. Control circuit 125 may subsequently turn on switch 111 or restart the startup mode. In some embodiments, for the output over-voltage protection function, apparatus 100 may detect the value of $V_{ZC}$ provided to node 165 during the off-time of switch 111.

As described above, node 165 may be used for multiple functions including the four functions: detection the zero crossing for the quasi-resonant operation, protection for output over-voltage, selection of the burst switching frequency during the burst mode, and selection of the foldback correction curve.

In some embodiments, node 165 may be an external terminal or external pin of an IC (IC chip) that contains at least a portion of apparatus 100. In some embodiments, peripheral circuit 160 may be outside the IC chip (e.g., on a circuit board). For example, in some embodiments, at least a portion of apparatus 100 such as startup circuit 170, control circuit 125, drive circuit 115, switch 111, and select circuit 155 may be contained in an IC chip, such as IC chip 188, as shown in FIG. 1, while peripheral circuit 160 may be outside IC chip 188. As described above, information may be provided to node 165 by choosing different values for the circuit components (e.g., resistors) in peripheral circuit 160. Thus, in some embodiments, the selection of $F_B$ and $V_{FBC}$ inside an IC chip, such as IC chip 188, may be done by choosing appropriate values of components of a circuit outside the IC chip (e.g., peripheral circuit 160). Further, since node 165 may be used for the multiple functions, as described above, an IC chip, such as IC chip 188, that contains at least a portion of apparatus 100 may have a reduction in at least one of size, pin count, and cost. FIG. 1 shows an example where switch 111 is outside an IC chip, such as IC chip 188. In some embodiments, switch 111 may be inside an IC chip, such as IC chip 188.

FIG. 2 through FIG. 5 are example timing diagrams showing various signals of apparatus 100 of FIG. 1.

Figure 2:
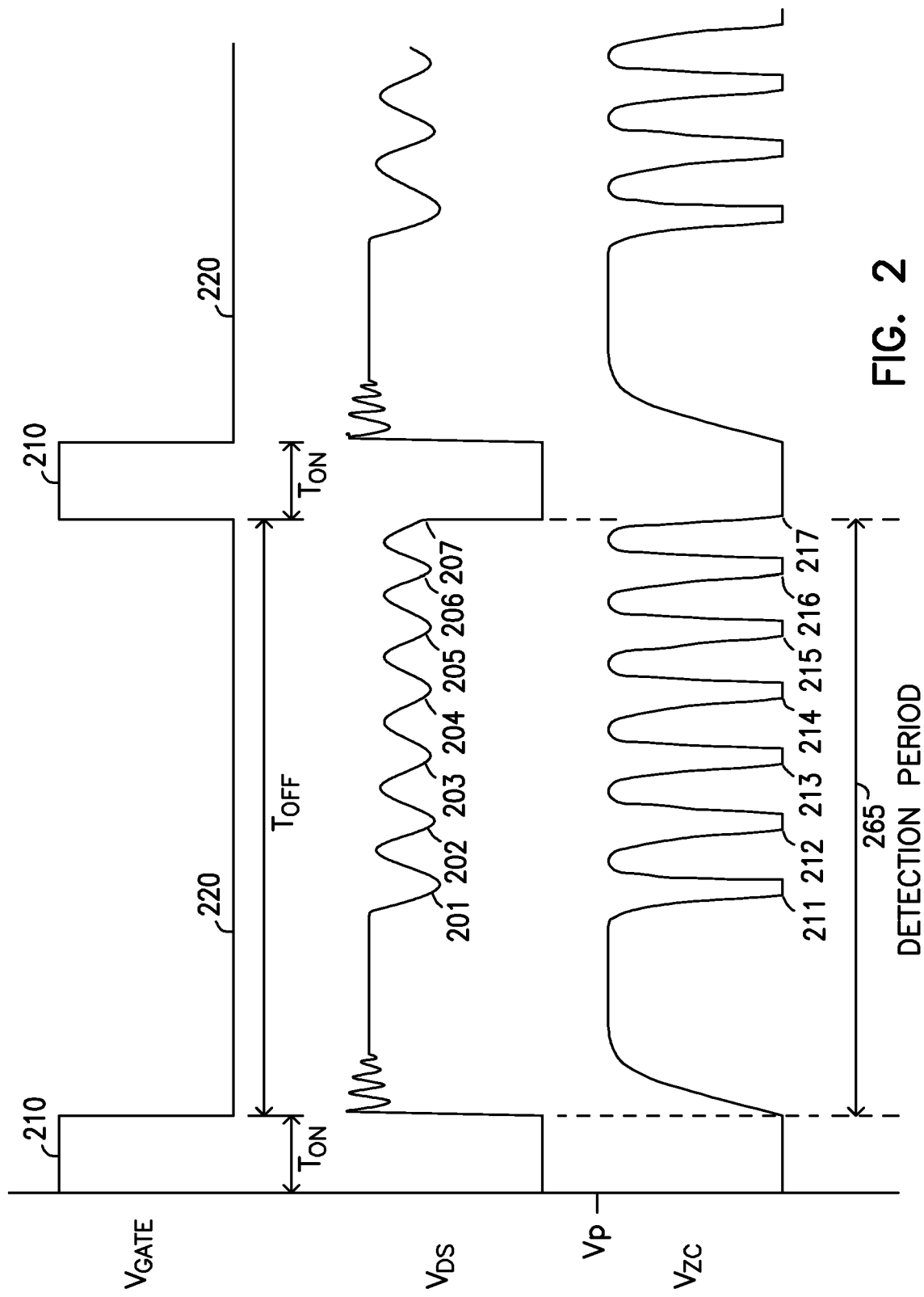
FIG. 2 through FIG. 5 are example timing diagrams for various signals of FIG. 1 according to some embodiments of the invention.

FIG. 2 is an example timing diagram for $V_{GATE}$, $V_{DS}$, and $V_{ZC}$ of apparatus 100 of FIG. 1. As shown in FIG. 2, $V_{GATE}$ has a high signal level 210 during an on-time $T_{ON}$ and a low signal level 220 during an off-time $T_{OFF}$. Switch 111 is turned on during $T_{ON}$ and turned off during $T_{OFF}$. As described in reference to FIG. 1, apparatus 100 may operate in a quasi-resonant operation. In FIG. 2, the behavior of $V_{DS}$ allows the quasi-resonant operation such that switch 111 (FIG. 1) may be turned on when $V_{DS}$ reaches a low value during $T_{OFF}$. For example, during $T_{OFF}$, $V_{DS}$ may resonate and cross seven points 201 through 207. Each of the points 201 through 207 may be commonly referred to as a zero crossing point in which $V_{DS}$ may be zero or substantially zero at each of the points 201 through 207. By detecting when $V_{DS}$ is at one of the points 201 through 207, apparatus 100 may turn on switch 111 to operate in the quasi-resonant operation. FIG. 2 shows an example where switch 111 is turned on at the seventh zero crossing (at point 207). In some embodiments, apparatus 100 may be configured such that $V_{GATE}$ may be activated high at a different time (e.g., at time corresponding to point 202) based on condition at load 180 (FIG. 1) so that switch 111 may be turned on at a different zero crossing point (e.g., at point 202).

As shown in FIG. 1, apparatus 100 detects the information, represented by $V_{ZC}$, at node 165 during a detection period 265 when switch 111 is turned off ($T_{OFF}$ in FIG. 2) to determine when $V_{DS}$ is at the zero crossing, so that apparatus 100 may activate $V_{GATE}$ high to turn on switch 111. As shown in FIG. 2, $V_{ZC}$ has points 211 through 217 corresponding to points 201 through 207 of $V_{DS}$. For example, when $V_{DS}$ is at point 202, $V_{ZC}$ is at point 212. The values of $V_{ZC}$ at points 211 through 217 of $V_{ZC}$ may be referred to as zero crossing information. Based on $V_{ZC}$, apparatus 100 may determine when $V_{DS}$ is at a zero crossing point. In apparatus 100, turning on switch 111 when $V_{DS}$ is at a zero crossing point (e.g. one of the points 201 through 207) may reduce the switch-on losses. Thus, power may be saved. In some embodiments, control circuit 125 of FIG. 1 may include a comparator to compare the value of $V_{ZC}$ at node 165 with a known value so that switch 111 may be turned on when $V_{ZC}$ reaches the known value. For example, control circuit 125 may compare $V_{ZC}$ with a known value of 50 millivolts (mV). In some embodiments, control circuit 125 may also include a counter to count the zero crossing points such that control circuit 125 may turn on switch 111 at different zero crossing point during the normal mode based on the value of the counter and the condition of load 180. For example, control circuit 125 may turn on switch 111 at the lower count value (e.g., at the second count value or the second zero crossing) when apparatus 100 determines (by monitoring $V_{FB}$) that load 180 may consume more power, and turn on switch 111 at a higher count value (e.g., the seventh count value or the seventh zero crossing) when apparatus 100 determines that load 180 may consume less or no power. The counter may be reset each time switch 111 is turned on, so that apparatus 100 may adjust the turning on of switch 111 to appropriately transfer power to meet the condition at load 180.

As describe above, apparatus 100 may also detect the value of $V_{ZC}$ for the output over-voltage protection function during the off-time of switch 111. In FIG. 2, for the over-voltage protection function, apparatus 100 may detect the value of $V_{ZC}$ during detection period 265, which is the same as the detection period for the zero crossing information. Apparatus 100 may compare the detected value of $V_{ZC}$ with a known value (e.g., Vp as shown in FIG. 2) and causes control circuit 125 to perform the over-voltage protection function when $V_{ZC}$ exceeds the known value such as Vp.

In FIG. 1, transfer circuit 120 may store power from input circuit 110 during $T_{ON}$ (FIG. 2) and transfer the stored power to output circuit 130 during $T_{OFF}$. For example, in embodiments where transfer circuit 120 includes a transformer, the transformer may be magnetized during $T_{ON}$ to store power, and may be demagnetized during $T_{OFF}$ to transfer the power to node 124.

Figure 3:
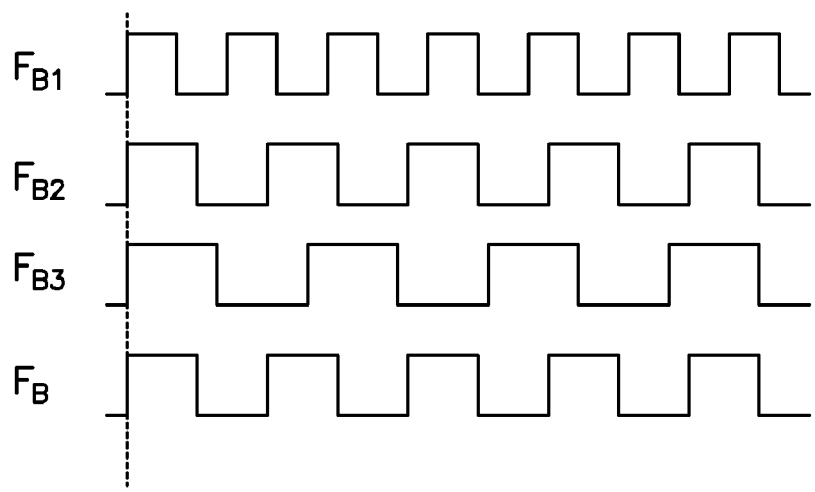

FIG. 3 is a timing diagram showing multiple selectable signals $F_{B1}$, $F_{B2}$, $F_{B3}$ according to an embodiment of the invention. As described in reference to FIG. 1, one of $F_{B1}$, $F_{B2}$, and $F_{B3}$ may be selected to be the burst switching frequency signal $F_B$ such that the switch frequency of switch 111 is based on the frequency of $F_B$. FIG. 3 shows an example where $F_{B2}$ is selected to be $F_B$. In some embodiments, $F_{B1}$ or $F_{B3}$ may also be selected to be $F_B$.

Figure 4:
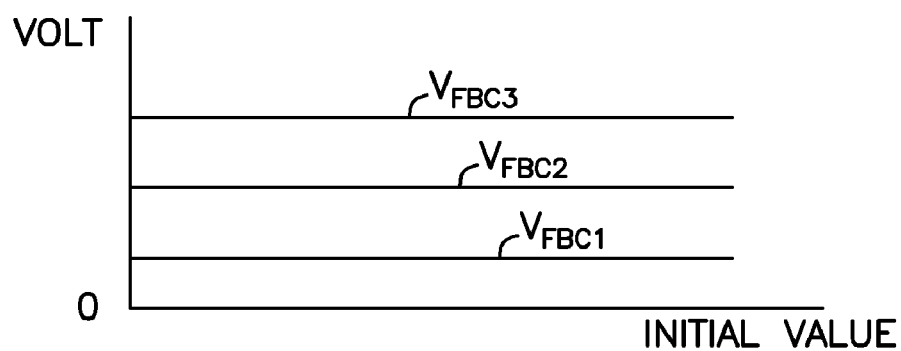
Figure 5:
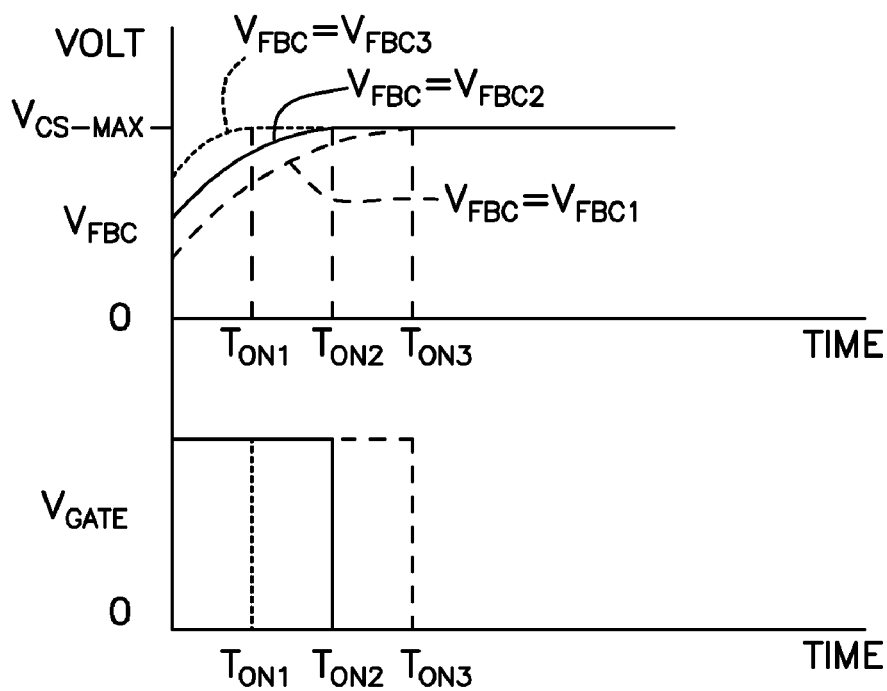

FIG. 4 and FIG. 5 are timing diagrams showing multiple selectable signals $V_{FBC1}$, $V_{FBC2}$, and $V_{FBC3}$ and $V_{GATE}$ according to an embodiment of the invention. As described in reference to FIG. 1, one of $V_{FBC1}$, $V_{FBC2}$, and $V_{FBC3}$ may be selected to be $V_{FBC}$ such that the on-time ($T_{ON}$) of $V_{GATE}$ during the normal mode may be adjusted. FIG. 4 shows $V_{FBC1}$, $V_{FBC2}$, and $V_{FBC3}$ having different initial values. FIG. 5 shows that each of $V_{FBC1}$, $V_{FBC2}$, and $V_{FBC3}$ may correspond to a different foldback correction curves with different $T_{ON}$ such as $T_{ON1}$, $T_{ON2}$, and $T_{ON3}$. By selecting $V_{FBC1}$, $V_{FBC2}$, and $V_{FBC3}$, different $T_{ON}$ (i.e., one of $T_{ON1}$, $T_{ON2}$, and $T_{ON3}$) for $V_{GATE}$ may be selected to select the maximum output power level. $V_{CS-MAX}$ in FIG. 5 corresponds to the maximum output power level. In some embodiments, control circuit 125 may be configured to change the slope of $V_{FBC}$ to change $T_{ON}$ of $V_{GATE}$ to one of $T_{ON1}$, $T_{ON2}$, and $T_{ON3}$ based on $V_{CS}$. In some embodiments, $V_{CS}$ may provide an indication of the output power level. Based on $V_{FBC}$ and $V_{CS}$, control circuit 125 of FIG. 1 may appropriately adjust the duty cycle including $T_{ON}$ of $V_{GATE}$ to influence the maximum output power level.

Figure 6:
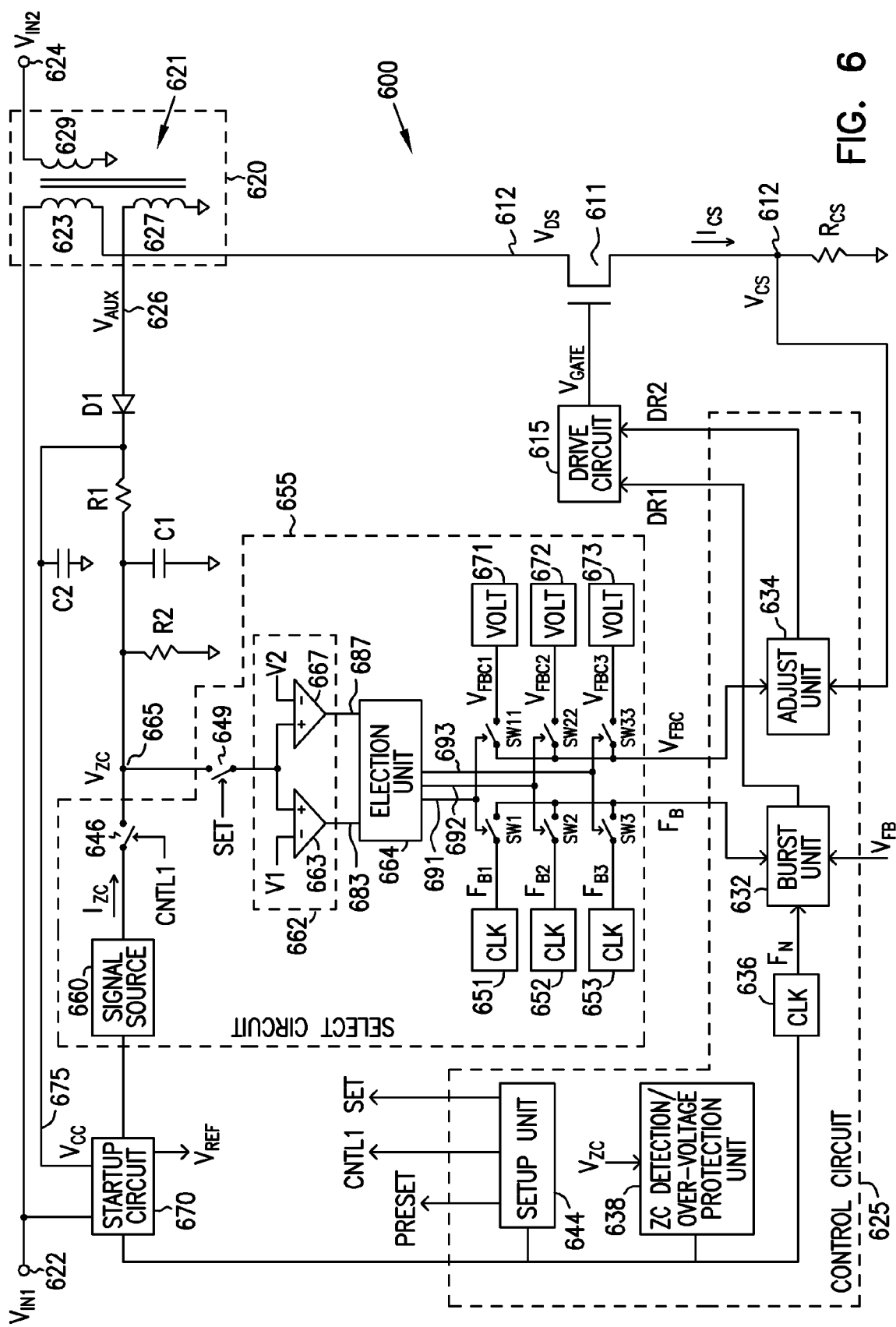
FIG. 6 shows an apparatus according to another embodiment of the invention.

FIG. 6 shows an apparatus 600 according to an embodiment of the invention. Apparatus 600 may include other circuit components such as input circuit 110, output circuit 130, load 180, and feedback circuit 140 of FIG. 1. In some embodiments, at least a portion of apparatus 600 may be included in or substituted for at least a portion of apparatus 100 of FIG. 1. Thus, in some embodiments, apparatus 600 may operate in the quasi-resonant operation. Apparatus 600 of FIG. 6 may include a startup mode, a normal mode, and a burst mode such as those described in apparatus 100 of FIG. 1.

In FIG. 6, a transistor 611 causes magnetization and demagnetization of a transformer 621 of a transfer circuit 620 so that $V_{IN1}$ from node 622 may be transferred to node 624 as $V_{IN2}$. In some embodiments, transistor 611 corresponds to switch 111 of FIG. 1. In FIG. 6, transistor 611 includes an n-channel metal-oxide-semiconductor field-effect transistor (MOSFET). In some embodiments, transistor 611 may include a different type of transistor. Transformer 621 includes windings 623 and 627 on the primary side and winding 629 on the secondary side. Winding 627 may be an auxiliary winding and may provide $V_{AUX}$. In some embodiments, the magnetization of transformer 621 happens during the on-time of transistor 611 and the demagnetization of transformer 621 happens during the off-time of transistor 611. $V_{AUX}$ may be used to provide a supply voltage $V_{CC}$ at supply node 675. A startup circuit 670 may be used to startup apparatus 600. A capacitor C2 may be used to charge node 675 during the startup mode of apparatus 600.

A drive circuit 615 switches transistor 611 using $V_{GATE}$. The frequency of $V_{GATE}$ is based on drive signals DR1 and DR2.

A control circuit 625 includes a burst unit 632 to provide DR1 and an adjust unit 634 to provide DR2. DR1 is affected by a burst switching frequency signal $F_B$ such that during the burst mode, drive circuit 615 switches transistor 611 at a frequency corresponding to the frequency of $F_B$. DR2 is affected by a foldback correction curve signal $V_{FBC}$ and a sense signal $V_{CS}$ such that the on-time of transistor 611 is based on the value of $V_{FBC}$ and $V_{CS}$. $V_{CS}$ is a product of $I_{CS}$ and a resistor $R_{CS}$. $F_B$ and $V_{FBC}$ are provided by a select circuit 655. In some embodiments, the on-time of transistor 611 corresponds to the on-time of switch 111 of FIG. 1.

Control circuit 625 also includes a setup unit 644 that provides a control signal CNTL1 to turn on and turn off a switch 646 during the startup mode, and a preset signal PRESET to activate other circuitry of apparatus 600 after the startup mode and at the beginning of the normal mode. Setup unit 644 also includes a SET signal to turn off a switch 649 after the startup mode.

Control circuit 625 also include a zero crossing (ZC) detection/over-voltage protection unit 638 to detect the zero crossing of $V_{DS}$ for the quasi-resonant operation and to monitor the value of $V_{ZC}$ to protect apparatus 600 from damage in an event such as an output over-voltage. In some embodiments, ZC detection/over-voltage protection unit 638 may include a first comparator circuitry to compare the value of $V_{ZC}$ during an off-time of transistor 611 for the detection of the zero crossing of $V_{DS}$, and a second comparator circuitry to compare the value of $V_{ZC}$ during an off-time of transistor 611 for the output over-voltage protection.

During the normal node, drive circuit 615 switches transistor 611 at the normal switching frequency using a clock signal $F_N$. A clock generator (CLK) 636 generates $F_N$. In some embodiments, clock generator 636 may include oscillator circuitry such that $F_N$ has a fixed frequency.

Apparatus 600 monitors the value of a feedback signal $V_{FB}$ to make a transition between the normal mode and the burst mode. In some embodiments, $V_{FB}$ in apparatus 600 may be similar to $V_{FB}$ of apparatus 100. Thus, by monitoring the value of $V_{FB}$ apparatus 600 may appropriately make a transition between the normal mode and the burst mode. In some embodiments, to monitor $V_{FB}$, burst unit 632 may include a comparator to compare $V_{FB}$ with a known value in apparatus 600. In some embodiments, $V_{FB}$ may be less than the known value when a load (e.g. load 180 of FIG. 1) consumes minimal power or has minimal activity. In some embodiments, when $V_{FB}$ is less than the known value, apparatus 600 may enter the burst mode and activate DR1 to cause drive circuit 615 to switch transistor 611 at a frequency corresponding to the frequency of $F_B$.

Clock generators (CLKs) 651, 652, and 653 provide signals $F_{B1}$, $F_{B2}$, and $F_{B3}$. In some embodiments, clock generators 651, 652, and 653 may include one or more oscillators to provide $F_{B1}$, $F_{B2}$, and $F_{B3}$ with different frequencies. Thus, the combination of clock generators 651, 652, and 653 may be called a variable clock generator. A signal source 660, a comparison unit 662, and an election unit 664 interact to select a burst switching frequency from among multiple selectable burst switching frequencies represented by signals $F_{B1}$, $F_{B2}$, and $F_{B3}$. The selected burst switching frequency corresponds to the frequency of $F_B$, which is the frequency of one of the $F_{B1}$, $F_{B2}$, and $F_{B3}$ signals.

Signal generators (VOLTs) 671, 672, and 673 provide signals $V_{FBC1}$, $V_{FBC2}$, and $V_{FBC3}$. In some embodiments, signal generators 671, 672, and 673 may include one or more voltage generators to provide $V_{FBC1}$, $V_{FBC2}$, and $V_{FBC3}$ with different voltage values. Thus, the combination of signal generators 671, 672, and 673 may be called a variable voltage generator. Signal source 660, comparison unit 662, and election unit 664 interact to select from among the signals $V_{FBC1}$, $V_{FBC2}$, and $V_{FBC3}$ to select a foldback correction curve for apparatus 600. The selected foldback correction curve is based on $V_{FBC}$, which is one of $V_{FBC1}$, $V_{FBC2}$, and $V_{FBC3}$.

In some embodiments, election unit 664 may include a decoding circuit to select one of $F_{B1}$, $F_{B2}$, and $F_{B3}$, and one of $V_{FBC1}$, $V_{FBC2}$, and $V_{FBC3}$ based on the result of comparison unit 662. The result of the comparison unit 662 is represented by a combination of the signals at the output nodes 683 and 687 of comparators 663 and 667. The combination of the signals at the output nodes 683 and 687 of comparators 663 and 667 is based on the value of $V_{ZC}$ at node 665. Different combinations of the signals at output nodes 683 and 687 cause election unit 664 to select a different one of $F_{B1}$, $F_{B2}$, and $F_{B3}$, and a different one of $V_{FBC1}$, $V_{FBC2}$, and $V_{FBC3}$. For example, when the value of $V_{ZC}$ is between V1 and V2, election unit 664 may activate a signal on one of the lines 691, 692, and 693 (e.g., line 692) to turn on switches SW2 and SW22 so that $F_{B2}$ may be selected to be $F_B$ and $V_{FBC2}$ may be selected to be $V_{FBC}$. Similarly, based on other values of $V_{ZC}$ (when $V_{ZC}$ is less than V1 or greater than V2), the signals on line 691 or 693 may be activated to turn on the corresponding switches SW1 and SW11, or SW3 and SW33, to select $F_{B1}$ or $F_{B3}$ to be $F_B$ and $V_{FBC1}$ or $V_{FBC3}$ to be $V_{FBC}$.

As described above, the selections of $F_B$ and $V_{FBC}$ are based on the information ($V_{ZC}$) provided to node 665. By providing different information at node 665, different values for $F_B$ and $V_{FBC}$ may be selected so that different burst switching frequencies may be selected for use during the burst mode and different foldback correction curves may also be selected. Similarly to apparatus 100, the information at node 665 of apparatus 600 during the off-time of transistor 611 may also be used for two other functions: output over-voltage protection and detection of the zero crossing for the quasi-resonant operation.

The information provided to node 665 is, in part, based on the values of $V_{AUX}$, resistors R1 and R2, and a current $I_{ZC}$. In some embodiments, signal source 660 may include a current source unit to generate $I_{ZC}$.

R1 and R2, capacitors C1 and C2, and a diode D1 may correspond to a peripheral circuit 160 of apparatus 100 of FIG. 1. As shown in FIG. 6, R1 and R2 in FIG. 6 form a voltage divider between node 626 ($V_{AUX}$) and node 665 ($V_{ZC}$). In some embodiments, the selection of the burst switching frequency ($F_B$) and the foldback correction curve ($V_{FBC}$) depends on the values of R1 and R2, and $I_{ZC}$. Thus, by appropriately choosing the values for R1 and R2, and $I_{ZC}$, different values for $F_B$ and $V_{FBC}$ may be selected. Since $V_{ZC}$ represents the information at node 665, different values for R1 and R2, and $I_{ZC}$ provide different information at node 665.

In the arrangement of apparatus 600 as shown in FIG. 6, $V_{ZC}$ may have different values during the on-time and off-time of transistor 611. For example, $V_{ZC}$ may be at one voltage value ($V_{ZC-ON}$) during the on-time of transistor 611 and another value ($V_{ZC-OFF}$) during the off-time of transistor 611.

As shown in FIG. 6, $V_{AUX}$ may be a negative voltage during the on-time of transistor 611. The negative voltage is blocked by D1. Thus, node 665 may not be influenced by $V_{AUX}$ during the on-time of transistor 611. Therefore, during the on-time of transistor 611, information may be provided to node 665 to select the burst switching frequencies for use during the burst mode, or to select the foldback correction curve, or to select both the burst switching frequency and the foldback correction curve. As mentioned above, information at node 665 during the off-time of transistor 611 may also be used for detection of the zero crossing for the quasi-resonant operation and for protection of output over-voltage and for the. Thus, in apparatus 600, the information ($V_{ZC}$) provided to or received by node 665 during both the on-time and off-time of transistor 611 may be used for four functions: detection of the zero crossing for the quasi-resonant operation, protection for output over-voltage, selection of the burst switching frequency during the burst mode, and selection of the foldback correction curve.

Based on the arrangement of apparatus 600, the value of $V_{ZC}$ ($V_{ZC-ON}$ and $V_{ZC-OFF}$) during the on-time and off-time of transistor 611 may be calculated based on equations (1) and (2) below.

$$V_{ZC-ON} = R2 * I_{ZC} \quad (1)$$

$$V_{ZC-OFF} = ((R2)/(R1+R1)) * V_{AUX} \quad (2)$$

Figure 7:
FIG. 7 is an example table according to an embodiment of the invention.

Table 700 in FIG. 7 provides known values for some of the parameters of equations (1) and (2). Based on equations (1) and (2) and table 700, the values for R1 and R2 may be calculated so that one of the burst switching frequency and the foldback correction curve may be selected.

In table 700, $V_{ZC-ON}$ represents is the value of the voltage at node 665 during the on-time of transistor 611. $V_{ZC-OFF}$ represents is the value of the voltage at node 655 during the off-time of transistor 611. $I_{ZC}$ represents the current provided by signal source 660. $V_{ZC-ON}$ may be a known value less than V1, a known value from V1 to V2, or a known value greater than V2. V3 is a known value for $V_{ZC-OFF}$. I1 represents the value for $I_{ZC}$. $F_{B1}$, $F_{B2}$, and $F_{B3}$ are the multiple selectable burst switching frequencies. $V_{FBC1}$, $V_{FBC2}$, and $V_{FBC3}$ are the multiple selectable foldback correction curves.

In some embodiments, V1 may be about 0.7 volt; V2 may be about 1.2 volts; V3 may be about 4.5 volts; I1 may be about 100 μA (microamperes); $F_{B1}$, $F_{B2}$, and $F_{B3}$ may be about 90 kHz (kilohertz), 60 kHz, and 30 kHz, respectively; and initial values of $V_{FBC1}$, $V_{FBC2}$, and $V_{FBC3}$ may be about 0.4 volt, 0.6 volt, and 0.8 volt, respectively.

Based on table 700, a burst switching frequency (one of $F_{B1}$, $F_{B2}$, and $F_{B3}$) and a foldback correction curve (one of $V_{FBC1}$, $V_{FBC2}$, and $V_{FBC3}$) may be selected.

For example, referring to table 700, when $F_{B2}$ and $V_{FBC2}$ are selected, V1, V2, or a value between V1 and V2 may substitute for $V_{ZC-ON}$ of equation (1), I1 may substitute for $I_{ZC}$. In equation (2), V3 may substitute for $V_{ZC-OFF}$. $V_{AUX}$ may be calculated based on the input voltage (e.g., $V_{IN1}$) and the construction of transformer 621 (FIG. 1).

Solving equations (1) and (2) with the values described above, the values for R1 and R2 may be obtained. Thus, based on table 700 of FIG. 7, the values of R1 and R2 may be appropriately chosen so that different burst switching frequencies and foldback correction curves may be selected. In some embodiments, table 700 may be used for selection of $F_B$ and $V_{FBC}$ of apparatus 100 of FIG. 1.

In some embodiments, apparatus 600 may perform the selection of $F_B$ and $V_{FBC}$ during a start mode before transistor 611 is turned on for the first time. For example, apparatus 600 may perform the selection of $F_B$ and $V_{FBC}$ after an input voltage (e.g., $V_{IN}$ of FIG. 1) is applied to apparatus 600 for the first time.

In some embodiments, some components of apparatus 600 are formed in an IC chip, while R1 and R2 may be components external to the IC chip. Thus, in some embodiments, the burst switching frequency corresponding to the frequency of $F_B$ inside the IC chip and the foldback correction curve corresponding to $V_{FBC}$ inside the IC chip may be selected by choosing appropriate values for the components outside the IC chip such as R1 and R2. As shown in FIG. 6, $F_{B1}$, $F_{B2}$, and $F_{B3}$ and $V_{FBC1}$, $V_{FBC2}$, and $V_{FBC3}$ of select circuit 655 may be selected or programmed by choosing values of other components outside select circuit 655, such as R1 and R2. Thus, select circuit 655 is a programmable circuit.

FIG. 6 shows some circuit components or signals in separated circuit units as an example embodiment of the invention. In some embodiments, the circuit boxes and the signals of apparatus 600 may be combined into fewer circuit blocks or distributed among more than the number of the circuit blocks shown in FIG. 6. In some embodiments, control circuit 625, drive circuit 615, startup circuit 670, and at least a portion of select circuit 655 are formed in a single IC chip (e.g. an IC chip similar to IC ship 188 of FIG. 1), such that node 665 is a single pin among the pins of the IC chip. In other embodiments, control circuit 625, drive circuit 615, startup circuit 670, at least a portion of select circuit 655, and transistor 611 are formed in a single IC chip, such that node 665 is a single pin among the pins of the IC chip.

Thus, in some embodiments, node 665 represents a pin of an IC chip in which the pin has four functions such as detection of the zero crossing for the quasi-resonant operation, protection for output over-voltage, selection of the burst switching frequency during the burst mode, and selection of the foldback correction curve.

Figure 8:
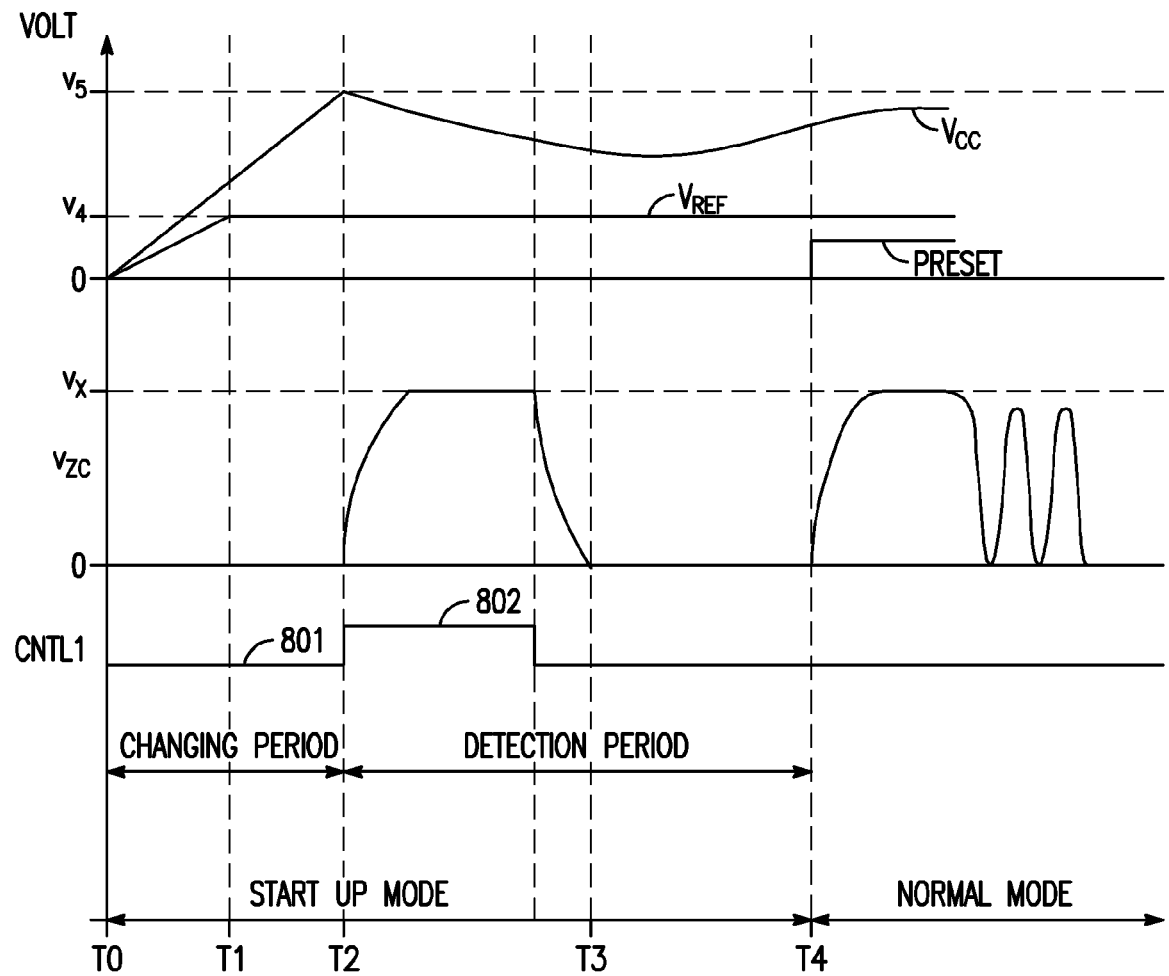
FIG. 8 is an example timing diagram for various signals of FIG. 6 according to an embodiment of the invention.

FIG. 8 is a timing diagram showing various signals of apparatus 600 during a startup mode. In FIG. 8, the startup mode is from time T0 to time T4; the normal mode begins at time T4. The startup mode includes a charging period from time T0 to time T2 and a detection period from time T2 to time T4. In some embodiments, the time interval between T2 and T4 may be about 10 microseconds to about 30 microseconds. Apparatus 600 detects the value of $V_{ZC}$ during the detection period to allow select circuit 655 to select $F_B$ (the burst switching frequency signal) and $V_{FBC}$ (the foldback correction curve).

Referring to FIG. 6 and FIG. 8, during the charging period in FIG. 8, C2 (FIG. 6) is charged from zero to V5. Thus, $V_{CC}$ at node 675 is charged from zero to V5. V5 may be the normal operating voltage of an IC chip that contains at least one of startup circuit 670, control circuit 625, and select circuit 655. In some embodiments, V5 may be about 20 volts. $V_{REF}$ is also charged from zero to V4 at some time during the charging period. In some embodiments, $V_{REF}$ may be about 5 volts. At the beginning of the detection period at time T2, setup unit 644 may activate CNTL1 to a high signal level 802 to turn on switch 646. When switch 646 is turned on, $I_{ZC}$ from signal source 660 flows to R2 through node 665, causing $V_{ZC}$ at node 665 to rise. $V_{ZC}$ reaches Vx at some time after time T2. At some time before time T3, setup unit 644 may deactivate CNTL1 to a low signal level 801 to turn off switch 646, causing $V_{ZC}$ to drop from Vx to zero at time T3. At time T4, setup unit 644 may activate the PRESET signal to begin the normal mode.

In some embodiments, Vx in FIG. 8 corresponds to $V_{ZC\text{-}ON}$ of table 700 of FIG. 7. Based on the value of Vx in FIG. 8, apparatus 600 selects $F_B$ and $V_{FBC}$ according to table 700. For example, when Vx is between V1 and V2, apparatus 600 selects $F_{B2}$ as the burst switching frequency signal and $V_{FBC2}$ as the foldback correction curve.

In some embodiments, switch 649 of FIG. 6 may be turned off by the SET signal before the normal mode begins. Node 665 is decoupled from select circuit 655 when switch 649 is turned off. In some embodiments, switch 649 may be omitted from apparatus 600 such that node 665 couples to select circuit 655 during the normal mode.

In some embodiments, setup unit 644 may include a default unit to cause select circuit 655 to select a default setting for the switching frequency for the burst mode, and a default setting for the foldback correction curve when apparatus 600 unsuccessfully detects $V_{ZC}$ during the startup mode (e.g., between times T0 and T4 in FIG. 8). In some embodiments, the default setting for the switching frequency for the burst mode may be the lowest switching frequency (e.g., $F_{B3}$ or 30 kHz in table 700 of FIG. 7). In some embodiments, the default setting for the foldback correction curve may be the largest voltage value for the foldback correction curve (e.g., a voltage value between V2 and V3 in table 700 of FIG. 7). In some embodiments, the largest value for the foldback correction curve may correspond to no foldback correction; the lowest switching frequency may correspond to the least amount of power for leaving the burst mode.

Figure 9:
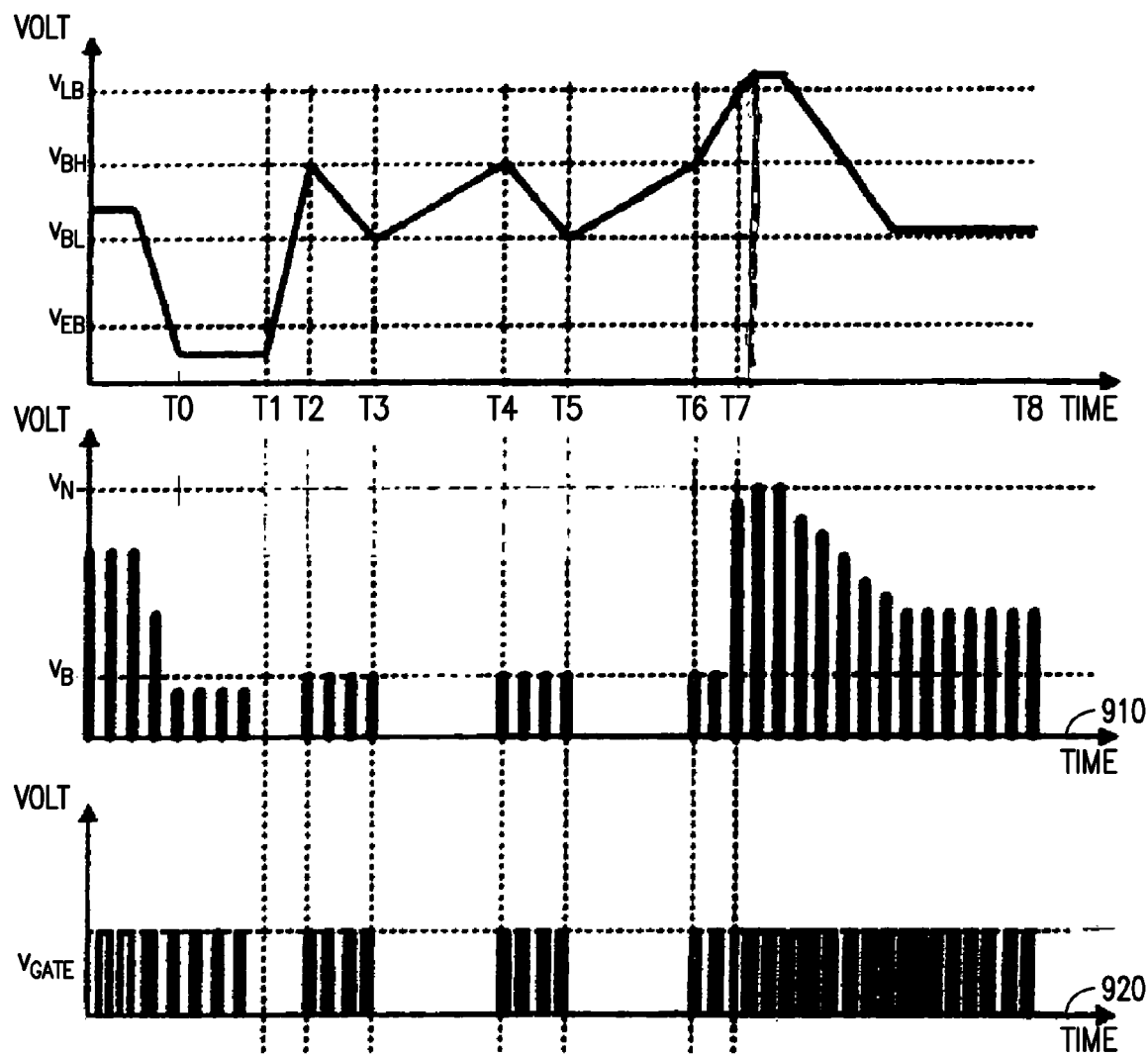
FIG. 9 is an example timing diagram for various signals during a burst mode according to some embodiments of the invention.

FIG. 9 is a timing diagram for various signals of apparatus 600 of FIG. 6 during the burst mode. In FIG. 9, between times T0 and T1, $V_{FB}$ drops below a threshold voltage $V_{EB}$, causing apparatus 600 to enter the burst mode at time T1. In some embodiments, $V_{FB}$ drops below $V_{EB}$ when power demand at a load (e.g. load 180 of FIG. 1) coupled to node 624 decreases (light load). In some embodiments, apparatus 600 may include a counter, as described in reference to FIG. 1, to turn on transistor 611 at the zero crossing based on the value of the counter. In some embodiments, the counter may reach the highest value such that apparatus 600 may already have turned on transistor 611 at the highest zero crossing point (e.g. the seventh zero crossing point) and $V_{FB}$ still drops below $V_{EB}$, such as a situation at time T0 as shown in FIG. 9. In some embodiments, $V_{EB}$ is about 2 volts.

In the burst mode, apparatus 600 switches transistor 611 at the fixed switching frequency corresponding to the frequency of the $F_B$ (which is selected from among $F_{B1}$, $F_{B2}$, and $F_{B3}$ as described above). During the burst mode, the value of $I_{CS}$ (primary current) may be set to be less than that of the maximum peak value of $I_{CS}$ at full load and minimum input voltage. In some embodiments, the maximum peak value of $I_{CS}$ at full load and minimum input voltage occur during the normal mode.

As shown in FIG. 9, $V_{CS}$ is at $V_B$ between times T0 and T7 and at $V_N$ before time T0 and after time T7. $V_B$ corresponds to $I_{CS}$ during the burst mode and $V_N$ corresponds to the $I_{CS}$ at full load and minimum input voltage. In some embodiments, $V_B$ is about 0.25 $V_N$ such that the current during the burst mode is about 0.25 of the current maximum peak current at full load and minimum input voltage.

During the burst mode between times T1 and T7, apparatus 600 toggles $V_{GATE}$ between a high signal level 910 and a low signal level 920 to switch (turn on and turn off) transistor 611 each time $V_{FB}$ reaches a burst-on voltage $V_{BH}$ (e.g., at T2 and T4). When transistor 611 is switched between times T2 and T3 or between times T4 and T5, $V_{FB}$ decreases if the load remains light. When $V_{FB}$ decreases to a burst-off voltage $V_{BL}$ (e.g., at times T3 and T5), apparatus 600 stops switching transistor 611 and waits for a next time $V_{FB}$ reaches $V_{BH}$. The process repeats such that $V_{FB}$ fluctuates between $V_{BH}$ and $V_{BL}$ during the burst mode. Between times T6 and T7, when the load increases and $V_{FB}$ is higher than a leave burst voltage $V_{LB}$, apparatus 600 leaves the burst mode and enters the normal mode. In the normal mode, the switching frequency of transistor 611 changes from a frequency corresponding to the frequency of $F_B$ to a frequency corresponding to the normal frequency. As described above, apparatus 600 may operate in the quasi-resonant operation during the normal mode.

Figure 10:
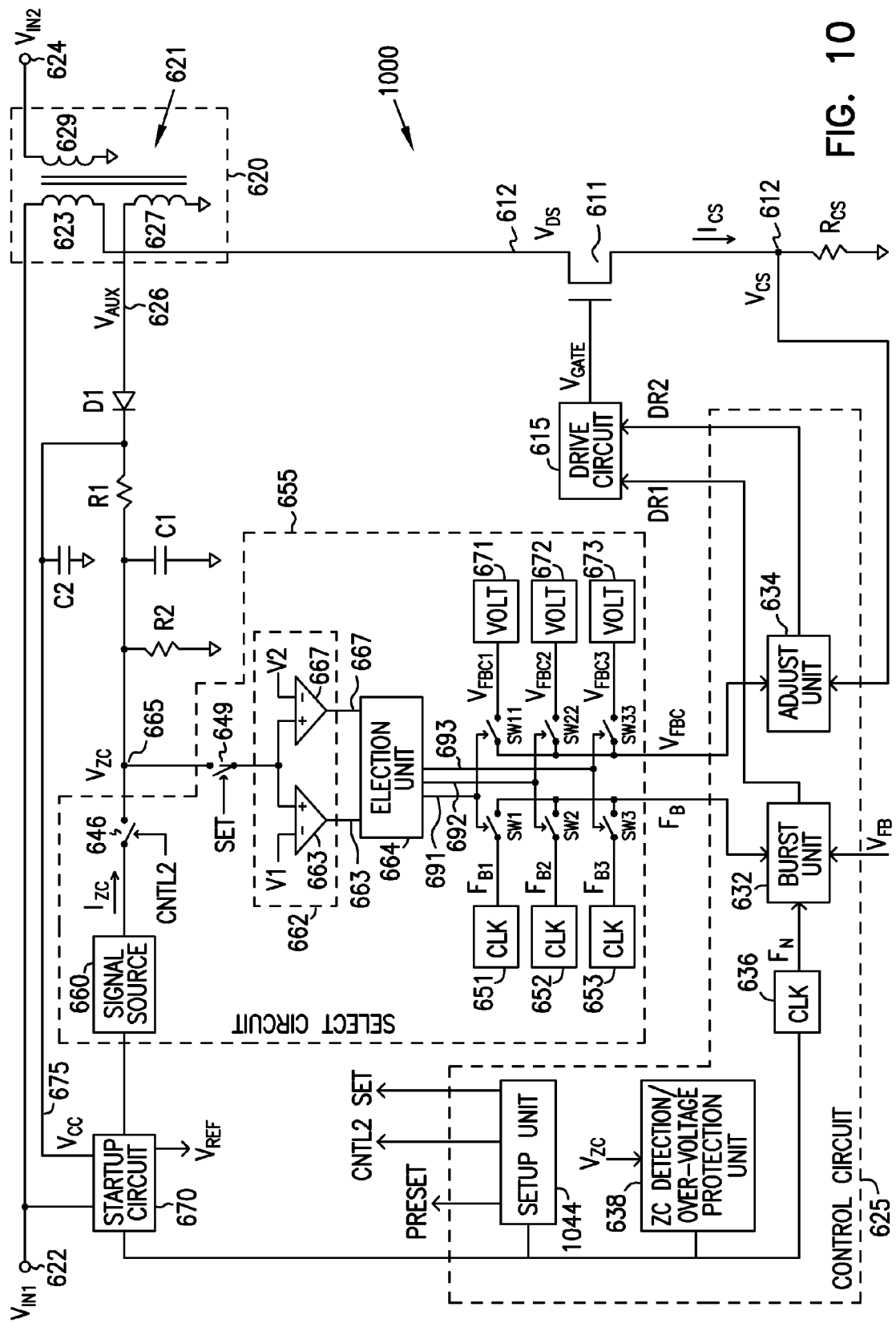
FIG. 10 shows an apparatus according to another embodiment of the invention.

FIG. 10 shows an apparatus 1000 according to an embodiment of the invention. Apparatus 1000 includes components similar to that of apparatus 600. For comparison purposes only, similar components in apparatus 600 and apparatus 1000 are designated with the same labels or reference numbers. In some embodiments, table 700 of FIG. 7 may also be used to select the values for the components (e.g., R1 and R2) of apparatus 1000 of FIG. 10.

In FIG. 10, apparatus 1000 uses a control signal CNTL2 from setup unit 1044 to control switch 646. In comparison with apparatus 600, the activation of CNTL2 of apparatus 1000 is different from the activation CNTL1 of apparatus 600, as described below in reference to FIG. 11. In some embodiments, the operation of apparatus 1000 in the normal and burst mode may be similar to that of apparatus 600 of FIG. 6.

Figure 11:
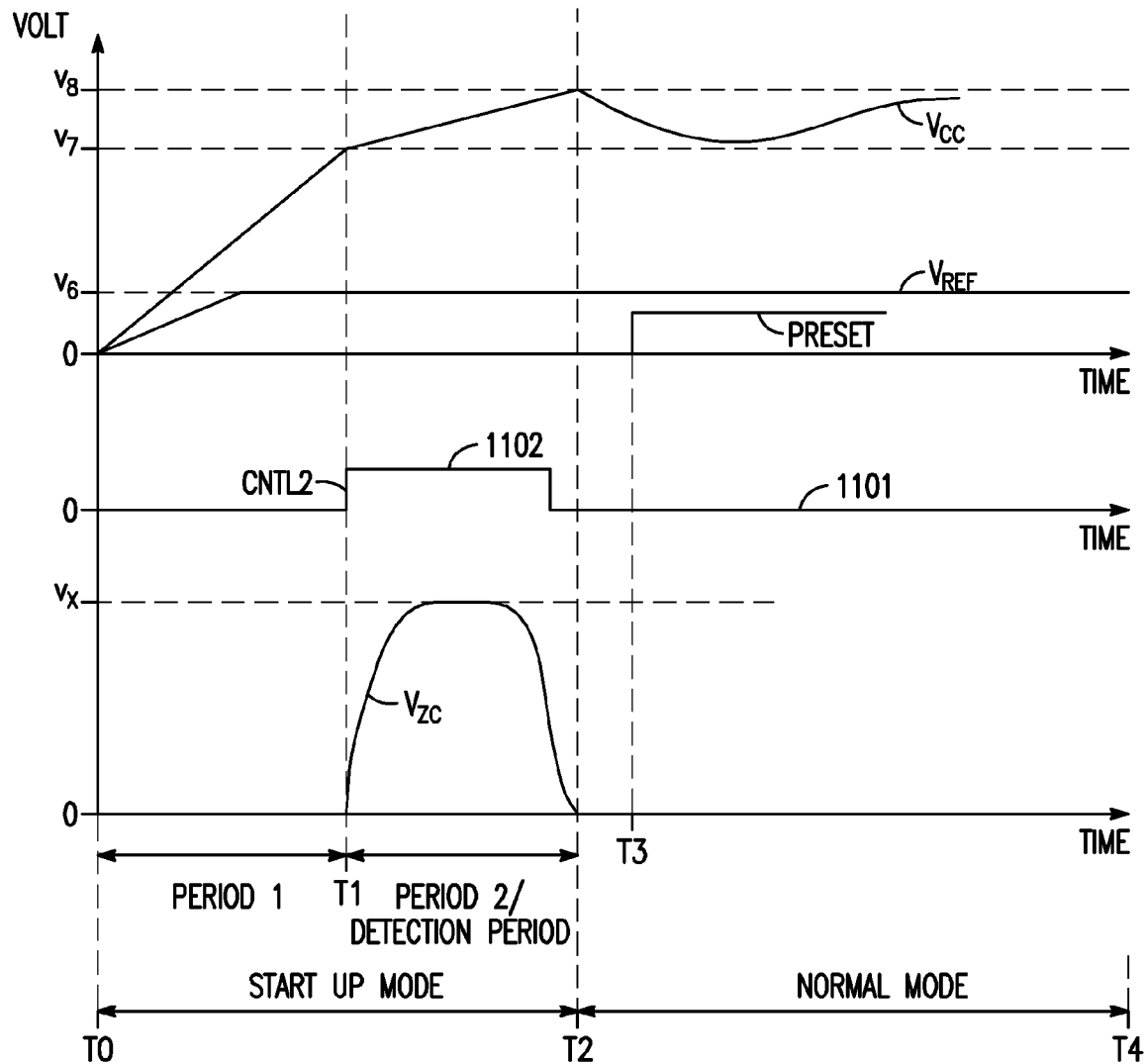
FIG. 11 is an example timing diagram for various signals of FIG. 10 according to an embodiment of the invention.

FIG. 11 is a timing diagram showing various signals for apparatus 1000 of FIG. 10. FIG. 11 shows a startup mode between times T0 and T2, and a normal mode between times T2 and T4. The startup mode includes a first charging period (PERIOD 1) and a second charging period (PERIOD 2). Apparatus 1000 performs detection of $V_{ZC}$ during the second charging period. Thus, the second charging period is also called the detection period as shown in FIG. 11.

As shown in FIG. 11, $V_{CC}$ is charged from zero to V7 during the first charging period and from V7 to V8 during the second charging period. In some embodiments, V8 may correspond to V5 of FIG. 8. In some embodiments, V8 may be about 20 volts and V7 may be about 10 volts to 15 volts. In some embodiments, setup unit 1044 of FIG. 10 may include a unit (e.g., a comparator) to determine when $V_{CC}$ reaches V7 and when $V_{CC}$ reaches V8. FIG. 11 also shows $V_{REF}$ and PRESET.

Referring to FIG. 10 and FIG. 11, at the beginning of the detection period at time T1, setup unit 1044 may activate CNTL2 to a high signal level 1102 to turn on switch 646. When switch 646 is turned on, $I_{ZC}$ from signal source 660 flows to R2 through node 665, causing $V_{ZC}$ at node 665 to rise. $V_{ZC}$ reaches Vx at some time after time T1. At some time before time T2, setup unit 1044 may deactivate CNTL2 to a low signal level 1101 to turn off switch 646, causing $V_{ZC}$ to drop from Vx to zero at time T2. At time T3 during the normal node, setup unit 1044 may activate the PRESET signal after $V_{CC}$ reaches V8. In some embodiments, setup unit 1044 may activate the PRESET at time T2.

In some embodiments, Vx in FIG. 11 corresponds to $V_{ZC-ON}$ of table 700 of FIG. 7. Based on the value of Vx in FIG. 11, apparatus 1000 selects $F_B$ and $V_{FBC}$ according to table 700. For example, when Vx is less than V1, apparatus 600 selects $F_{B1}$ as the burst switching frequency signal and $V_{FBC1}$ as the foldback correction curve.

In some embodiments, setup unit 1044 may include a unit (e.g., a comparator) to determine when the voltage at node 675 (or $V_{CC}$) reaches V7 and V8.

In some embodiments, switch 649 of FIG. 10 may be turned off by the SET signal before the normal mode begins. Node 665 is decoupled from select circuit 655 when switch 649 is turned off. In some embodiments, switch 649 may be omitted from apparatus 1000 such that node 665 couples to select circuit 655 during the normal mode.

Figure 12:
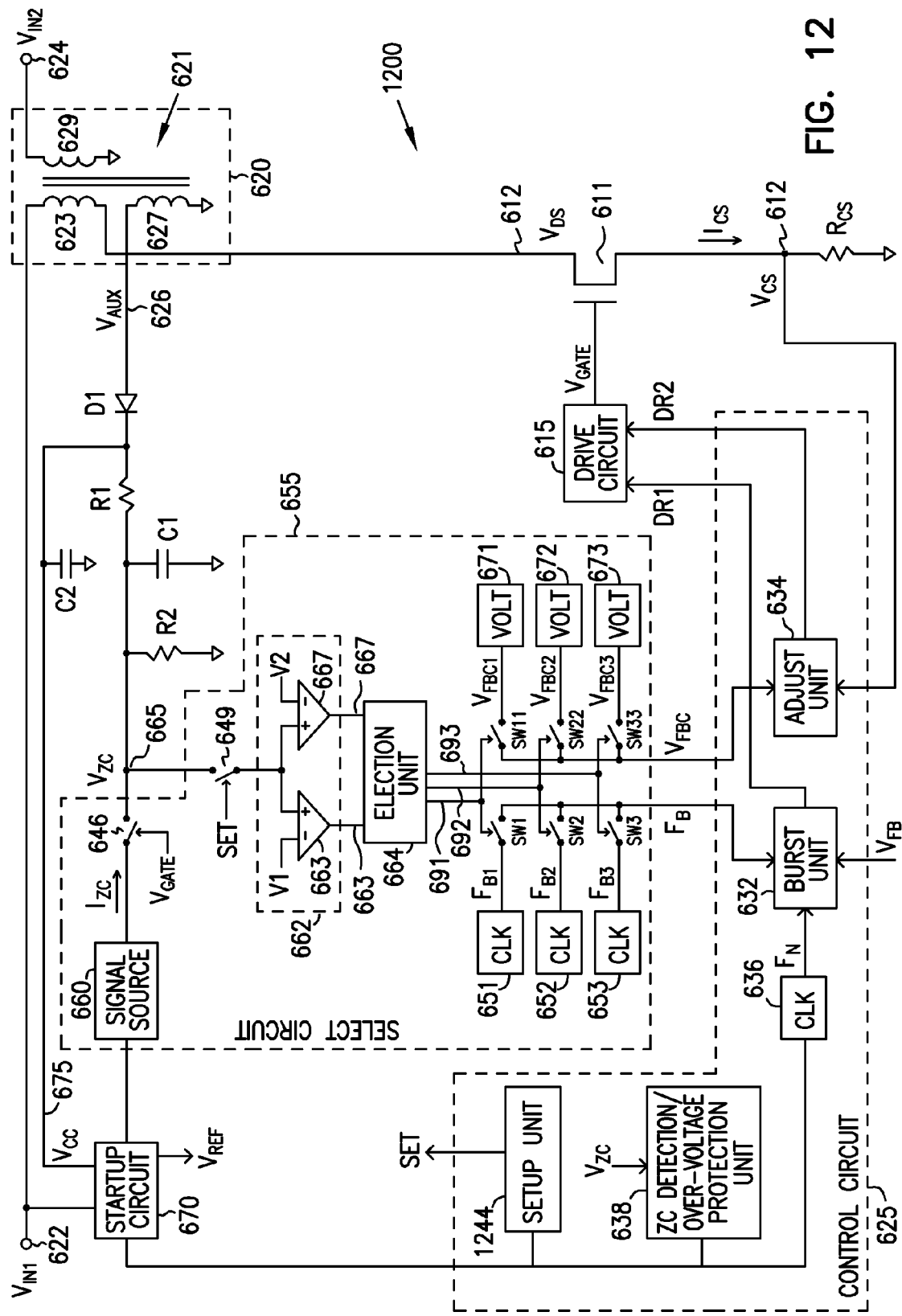
FIG. 12 shows an apparatus according to another embodiment of the invention.

FIG. 12 shows an apparatus 1200 according to an embodiment of the invention. Apparatus 1200 includes components similar to that of apparatus 600 of FIG. 6 and apparatus 100 of FIG. 1000. For comparison purposes only, similar components in apparatus 600, apparatus 1000, and apparatus 1200 are designated with the same labels or reference numbers. In some embodiments, table 700 of FIG. 7 may also be used to select the values for the components (e.g., R1 and R2) of apparatus 1200 of FIG. 12.

In FIG. 12, apparatus 1200 uses $V_{GATE}$ from drive circuit 615 to control switch 646. This differs from both apparatus 600 and 1000 of FIG. 6 and FIG. 10, as apparatus 600 uses a control signal CNTL1 from setup unit 644 to control switch 646, apparatus 1000 uses a control signal CNTL2 from setup unit 1044 to control switch 646. In some embodiments, the operation of apparatus 1200 in the normal and burst mode may be similar to that of apparatus 600 of FIG. 6 or apparatus 1000 of FIG. 10.

Figure 13:
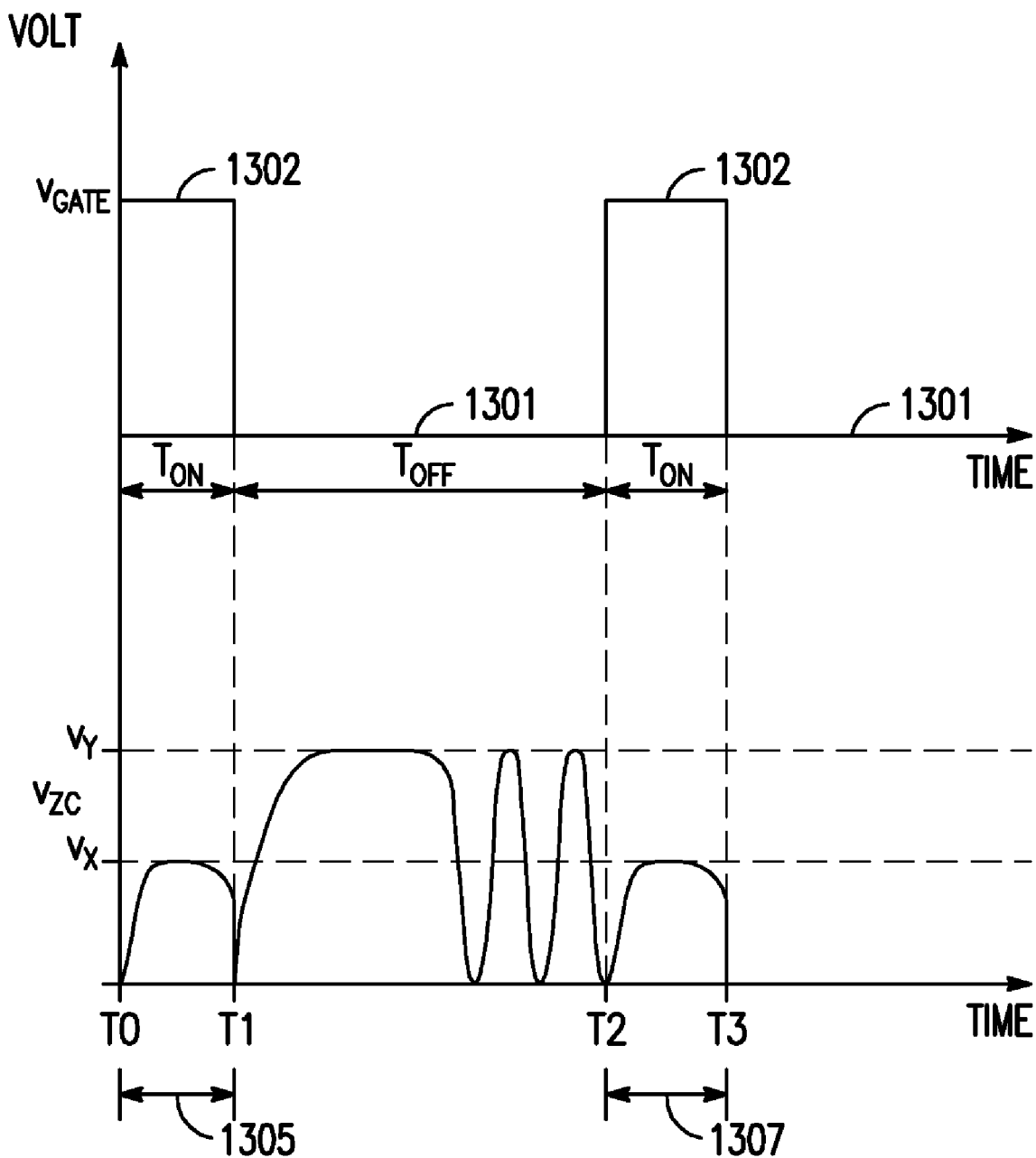
FIG. 13 is an example timing diagram for various signals of FIG. 12 according to an embodiment of the invention.

FIG. 13 is a timing diagram showing various signals for apparatus 1200 of FIG. 12. In FIG. 13, $V_{GATE}$ is activated to a high signal level 1302 during the on-time $T_{ON}$ between times T0 and T1 and between times T2 and T3. $V_{GATE}$ is deactivated to a low signal level 1301 during the off-time $T_{OFF}$ between times T1 and T2. $V_{ZC}$ has a voltage Vx during $T_{ON}$ and a voltage Vy during $T_{OFF}$. In some embodiments, Vx corresponds to $V_{ZC-ON}$ and Vy corresponds to $V_{ZC-OFF}$ of table 700 of FIG. 7.

FIG. 13 also shows detection periods 1305 and 1307. Apparatus 1200 may detect the value of $V_{ZC}$ during one or both of detection periods 1305 and 1307 to select $F_B$ and $V_{FBC}$. In some embodiments, detection periods 1305 and 1307 occur after the startup mode of apparatus 1200. Apparatus 1200 uses the information at node 665 (e.g., the value of $V_{ZC}$ corresponding to Vx) during detection period 1305 to select $F_B$ and $V_{FBC}$ accordingly.

Referring to FIG. 12 and FIG. 13, at the beginning of the detection period 1305 at time T0, drive circuit 615 may activate $V_{GATE}$ to high signal level 1302 to turn on switch 646. When switch 646 is turned on, $I_{ZC}$ from signal source 660 flows to R2 through node 665, causing $V_{ZC}$ at node 665 to rise. $V_{ZC}$ reaches Vx at some time after time T0. Between times T1 and T2, drive circuit 615 may deactivate $V_{GATE}$ to low signal level 1301 to turn off switch 646. The value of $V_{ZC}$ between times T1 and T2 is based on equation (2) as described in reference to FIG. 6. Apparatus 1200 may ignore the detection of the value (Vx) of $V_{ZC}$ during detection period 1307 if apparatus 1200 successfully detects the value $V_{ZC}$ during detection period 1305. In some embodiments, apparatus 1200 may repeat the detection of the value of $V_{ZC}$ during detection period 1307 if apparatus 1200 unsuccessfully detects the value $V_{ZC}$ during detection period 1305. In some embodiments, setup unit 1244 may include a default unit to cause select circuit 655 to select a default setting for the switching frequency for the burst mode and a default setting for the foldback correction curve when apparatus 1200 unsuccessfully detects $V_{ZC}$ after detection period 1305 or after both detection periods 1305 and 1307. In some embodiments, the default setting for the switching frequency for the burst mode and the foldback correction curve of apparatus 1200 may be similar to that of apparatus 600.

In some embodiments, setup unit 1244 may activate the SET signal to turn off switch 649 after the value of $V_{ZC}$ is successfully detected or after the default settings are set. In some embodiments, switch 649 may be omitted from apparatus 1200 such that node 665 couples to select circuit 655 during the normal mode.

Figure 14:
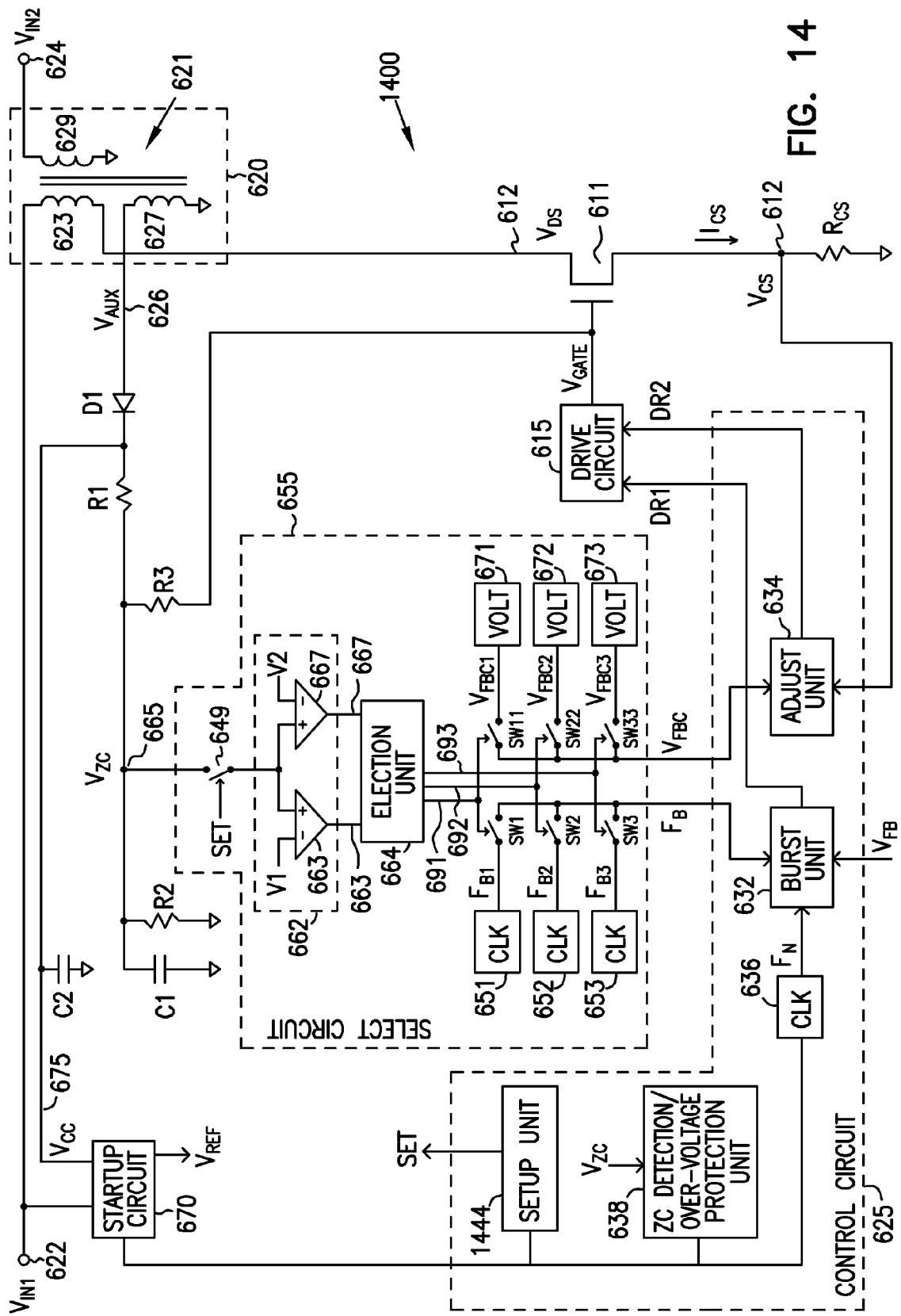
FIG. 14 shows an apparatus according to another embodiment of the invention.

FIG. 14 shows an apparatus 1400 according to an embodiment of the invention. For comparison purposes only, similar components in apparatuses 600, 1000, 1200, and 1400 are designated with the same labels or reference numbers. In some embodiments, table 700 of FIG. 7 may also be used to select the values for the components (e.g., R1, R2, and R3) of apparatus 1400 of FIG. 14.

In comparison with apparatuses 600, 1000, and 1200, apparatus 1400 excludes signal source 660 and includes resistor R3 coupled between node 665 and the gate of transistor 611. In some embodiments, the operation of apparatus 1400 in the normal and burst mode may be similar to that of apparatuses 600, 1000, and 1200. For example, apparatus 1400 of FIG. 14 may use the information represented by $V_{ZC}$ at node 665 for four functions: detection of the zero crossing for the quasi-resonant operation, protection for output over-voltage, selection of the burst switching frequency during the burst mode, and selection of the foldback correction curve.

The information ($V_{ZC}$) at node 665 during the on-time and off-time of transistor 611 may be calculated based on equations (3) and (4) below.

$$V_{ZC-ON} = ((R2)/(R2+R3)) * V_{GATE} \quad (3)$$

$$V_{ZC-OFF} = [(R2//R3)/(R3//(R1+R2))] * V_{AUX} \quad (4)$$

In Equation (4) the symbol "//" refers to a parallel combination. For example, R2//R3 refers to the parallel combination of R2 and R3.

Table 700 in FIG. 7 provides known values for some of the parameters of equations (3) and (4) above. Based on equations (3) and (4) and table 700, the values for R1, R2, and R3 may be calculated so that one of the burst switching frequency and the foldback correction curve may be selected.

Figure 15:
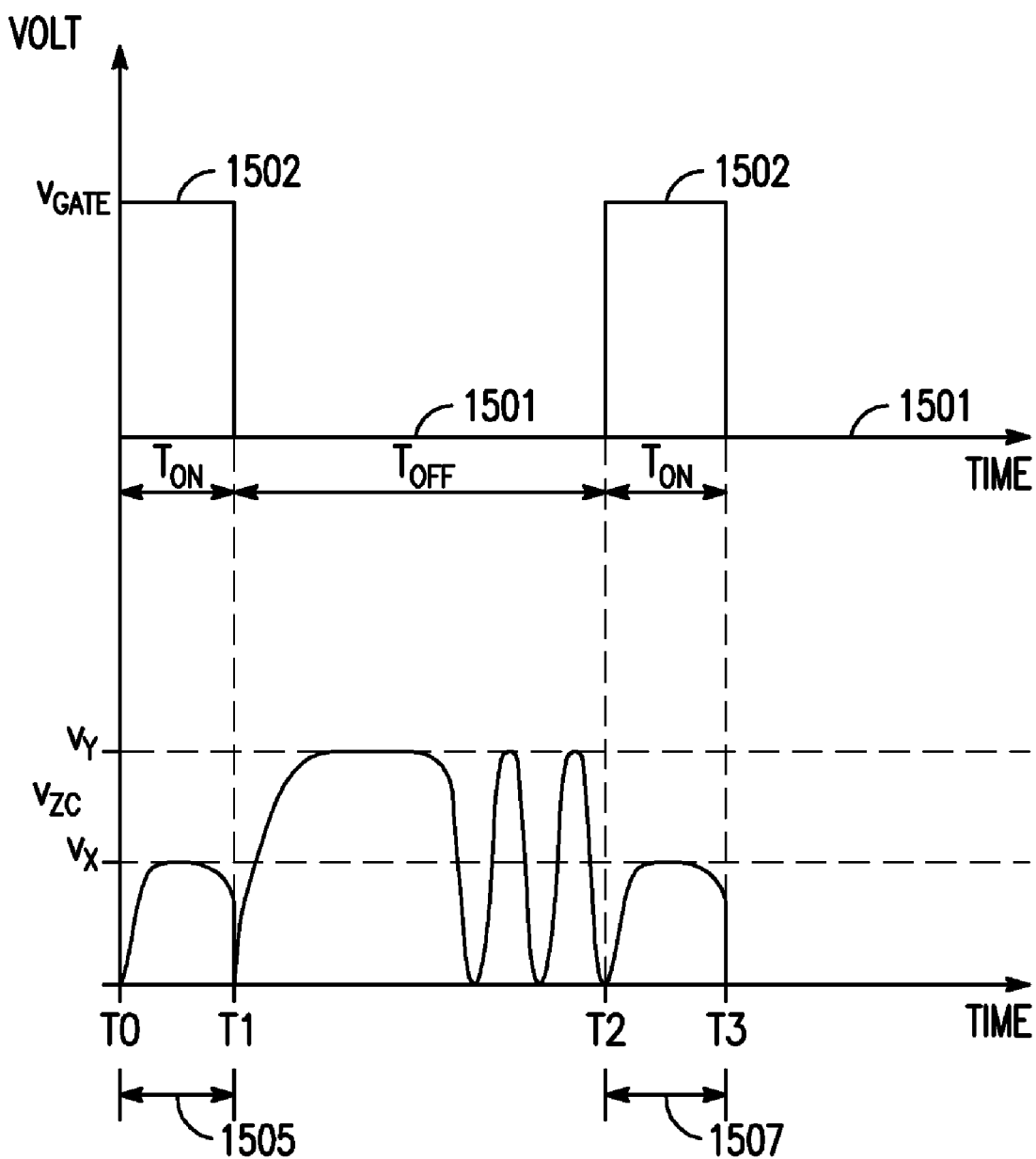
FIG. 15 is an example timing diagram for various signals of FIG. 14 according to an embodiment of the invention.

FIG. 15 is a timing diagram showing various signals for apparatus 1400 of FIG. 14. In FIG. 15, $V_{GATE}$ is activated to a high signal level 1502 during the on-time $T_{ON}$ between times T0 and T1 and between times T2 and T3. $V_{GATE}$ is deactivated to a low signal level 1501 during the off-time $T_{OFF}$ between times T1 and T2. $V_{ZC}$ has a voltage Vx during $T_{ON}$ and a voltage Vy during $T_{OFF}$. In some embodiments, Vx corresponds to $V_{ZC-ON}$ and Vy corresponds to $V_{ZC-OFF}$ of table 700 of FIG. 7.

FIG. 15 also shows detection periods 1505 and 1507. Apparatus 1400 may detect the value of $V_{ZC}$ during one or both of detection periods 1505 and 1507 to select $F_B$ and $V_{FBC}$. In some embodiments, detection periods 1505 and 1507 occur after the startup mode of apparatus 1200.

Referring to FIG. 14 and FIG. 15, during detection period 1505, drive circuit 615 may activate $V_{GATE}$ to high signal level 1502. Switch 611 is turned on. $V_{AUX}$ may be a negative. Thus, $V_{ZC}$ may not be influenced by $V_{AUX}$ during detection period 1505 when transistor 611 is turned on. The value of $V_{ZC}$ during detection period 1505 is based on equation (3) as described in reference to FIG. 14. $V_{ZC}$ reaches Vx at some time during detection period 1505. Select circuit 655 uses the information at node 665 (e.g., the value of $V_{ZC}$ corresponding to Vx) during detection period 1505 to select $F_B$ and $V_{FBC}$ accordingly. Drive circuit 615 may deactivate $V_{GATE}$ to low signal level 1501 between times T1 and T2. The value of $V_{ZC}$ between times T1 and T2 is based on equation (4) as described in reference to FIG. 14. Apparatus 1400 may ignore the detection of the value (Vx) of $V_{ZC}$ during detection period 1507 if apparatus 1400 successfully detects the value $V_{ZC}$ during detection period 1505. In some embodiments, apparatus 1400 may repeat the detection of the value of $V_{ZC}$ during detection period 1507 if apparatus 1400 unsuccessfully detects the value $V_{ZC}$ during detection period 1505. In some embodiments, setup unit 1444 may include a default unit to cause select circuit 655 to select a default setting for the switching frequency for the burst mode and a default setting for the foldback correction curve when apparatus 1400 unsuccessfully detects $V_{ZC}$ after detection period 1505 or after both detection periods 1505 and 1507. In some embodiments, the default setting for the switching frequency for the burst mode and the foldback correction curve of apparatus 1400 may be similar to that of apparatus 600.

In some embodiments, setup unit 1444 may activate the SET signal to turn off switch 649 after the value of $V_{ZC}$ is successfully detected or after the default settings are set. In some embodiments, switch 649 may be omitted from apparatus 1400 such that node 665 couples to select circuit 655 during the normal mode.

Figure 16:
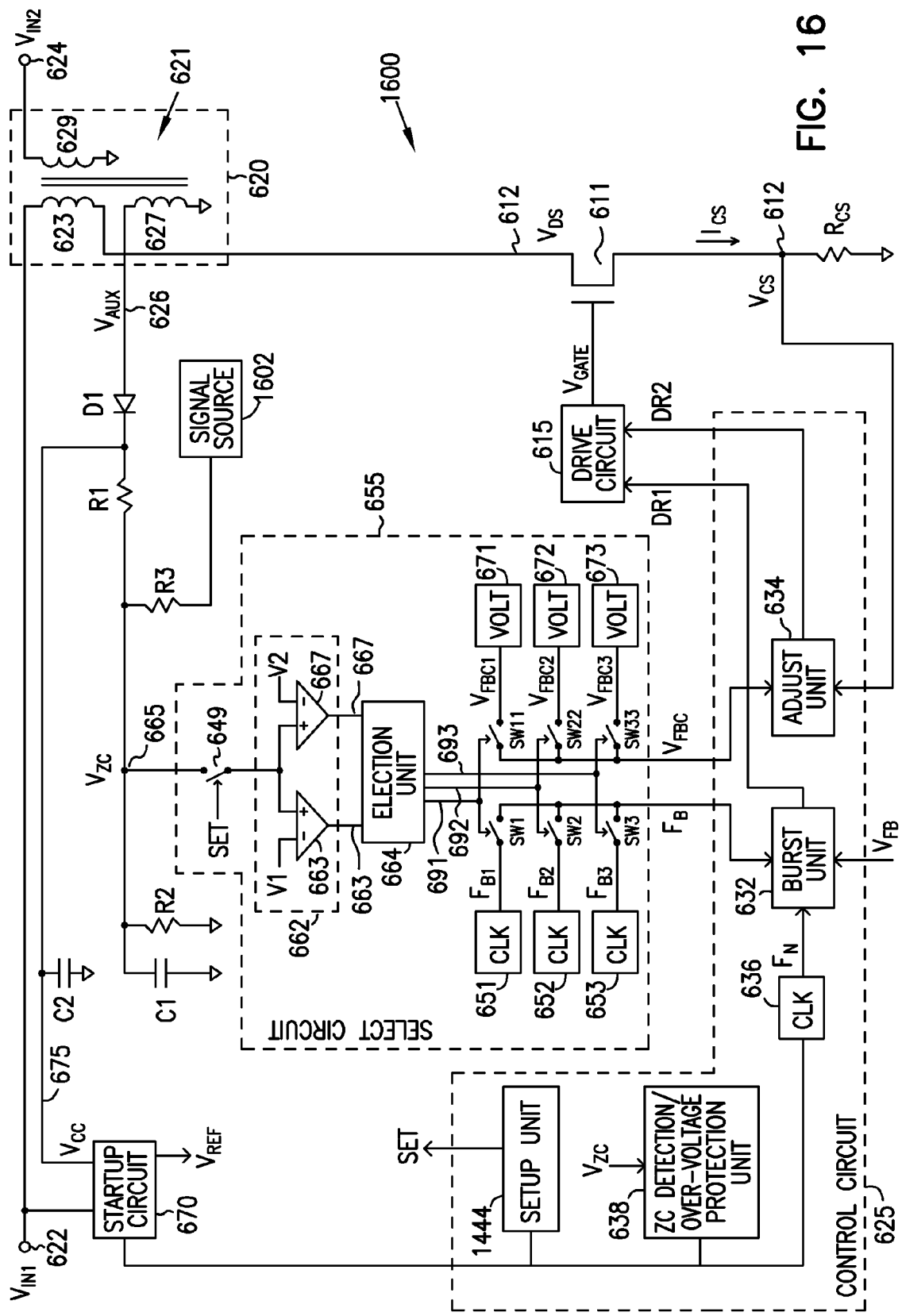
FIG. 16 shows an apparatus according to another embodiment of the invention.

FIG. 16 shows an apparatus 1600 according to an embodiment of the invention. For comparison purposes only, similar components in apparatuses 1400 and 1600 are designated with the same labels or reference numbers. In some embodiments, table 700 of FIG. 7 may also be used to select the values for the components (e.g., R1, R2, and R3) of apparatus 1600 of FIG. 16.

In comparison with apparatus 1400 of FIG. 14, apparatus 1600 includes a signal source 1602 coupled to resistor R3. Signal source 1602 may be a voltage source or a current source. Signal source 1602 may be activated during a detection period, such as detection period 1505 or 1507 of FIG. 15, so that the value of $V_{ZC}$ at node 665 may be detected to select the appropriate $F_B$ and $V_{FBC}$.

In the above description, each of the apparatuses 600, 1000, 1200, 1400, and 1600 may include other circuit components such as input circuit 110, output circuit 130, load 180, and feedback circuit 140 of FIG. 1. In some embodiments, at least a portion of each of the apparatuses 600, 1000, 1200, 1400, and 1600 may be included in or substituted for at least a portion of apparatus 100 of FIG. 1.

In the description of FIG. 1 through FIG. 16 above, apparatus 100, 600, 1000, 1200, 1400, and 1600 may be included in a device or a system. For example, a system may include computers (e.g., desktops, laptops, hand-helds, servers, Web appliances, routers, etc.), wireless communication devices (e.g., satellite receivers, cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, digital versatile disks or DVDs, camcorders, digital cameras, MP3 (Motion Picture Experts Group, Audio Layer 3) players, video games, watches, etc.), and the like.

The above description and the drawings illustrate some specific embodiments of the invention sufficiently to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those of skill in the art upon reading and understanding the above description. Therefore, the scope of various embodiments of the invention is determined by the appended claims, along with the full range of equivalents to which such claims are entitled.

What is claimed is:

1. An apparatus comprising:

a pin to receive information;

a select circuit responsive to the information received at the pin to select a selected burst switching frequency from multiple selectable burst switching frequencies based on a value of the information received at the pin, wherein the pin is configured to couple to resistors that form a voltage divider, and the value of the information received at the pin is based on values of the resistors, wherein the select circuit includes a generator to generate a plurality of first selectable signals having frequencies corresponding to the multiple selectable frequencies, a comparator to compare the information received at the pin with a voltage to produce a comparison result, and an election unit responsive to the comparison result to select one of the first selectable signals to be a selected signal, and wherein the selected burst switching frequency corresponds to the frequency of the selected signal;
a drive circuit to provide a signal to switch a switch to transfer power from an input node to an output node during a normal mode and a burst mode; and
a control circuit coupled to the select circuit and the drive circuit to enable the drive circuit to switch the switch at the selected burst switching frequency during the burst mode.

2. The apparatus of claim 1, wherein the select circuit is configured to select a selected foldback correction curve from multiple foldback correction curves based on the information received at the pin to control a power level of the apparatus based on the selected foldback correction curve.

3. The apparatus of claim 2, wherein the switch includes a first terminal to receive the signal from the select circuit, a second terminal coupled to a first voltage, and a third terminal coupled to a second voltage, and wherein the pin is configured to detect a zero crossing of a signal at the second terminal of the switch.

4. The apparatus of claim 3, wherein the control circuit is coupled to the pin to perform an over-voltage protection function based on the information received at the pin.

5. The apparatus of claim 1, wherein the select circuit is programmable to select different burst switching frequencies and different foldback correction curves based on different information received at the pin.

6. The apparatus of claim 1, wherein the select circuit is configured to select the selected burst switching frequency based on the information received at the pin when the switch is turned on.

7. The apparatus of claim 1 wherein the select circuit is configured to select the selected burst switching frequency during a startup mode.

8. An apparatus comprising:
a pin to receive information;
a select circuit responsive to the information received at the pin to select a selected burst switching frequency from multiple selectable burst switching frequencies, the select circuit including a generator to generate a plurality of first selectable signals having frequencies corresponding to the multiple selectable frequencies, wherein the select circuit includes a first comparator to compare the information received at the pin with a first voltage to produce a first comparison result, and an election unit responsive to the first comparison result to select one of the first selectable signals to be a selected signal, wherein the selected burst switching frequency corresponds to the frequency of the selected signal;
a drive circuit to provide a signal to switch a switch to transfer power from an input node to an output node during a normal mode and a burst mode; and
a control circuit coupled to the select circuit and the drive circuit to enable the drive circuit to switch the switch at the selected burst switching frequency during the burst mode.

9. The apparatus of claim 8, wherein the select circuit further includes a second comparator to compare the information received at the pin with a second voltage to produce a second comparison result, and wherein the election unit is configured to be responsive to both the first and second comparison results to select the selected signal.

10. The apparatus of claim 1, wherein the select circuit further includes a signal source to create a voltage at the pin to present the information received at the pin.

11. The apparatus of claim 1, wherein the control circuit includes a default unit to select a default burst switching frequency when the election unit unsuccessfully selects the selected burst switching frequency.

12. An apparatus comprising:
a drive circuit to provide a signal to switch a transistor to transfer power from an input node to an output node during a normal mode and a burst mode;
a control circuit coupled to the drive circuit to enable the drive circuit to switch the transistor at a switching frequency;
a pin coupled to the control circuit to detect a first information during a first a detection period to turn on the transistor based on the first information, and to detect a second information during a second detection period, the first information being related to a minimum drain-to-source voltage of the transistor when the transistor is turned off, wherein the pin is configured to couple to resistors that form a voltage divider, and the value of at least one of the first information and the second information received at the pin is based on values of the resistors; and
a select circuit responsive to the second information received at the pin to select a selected burst switching frequency from multiple selectable burst switching frequencies based on a value of the second information received at the pin, wherein the select circuit includes a generator to generate a plurality of first selectable signals having frequencies corresponding to the multiple selectable frequencies, a comparator to compare the second information received at the pin with a voltage to produce a comparison result, and an election unit responsive to the comparison result to select one of the first selectable signals to be a selected signal, and wherein the selected burst switching frequency corresponds to the frequency of the selected signal.

13. The apparatus of claim 12, wherein the control circuit is configured to enable the drive circuit to switch the transistor at the selected burst switching frequency during the burst mode.

14. The apparatus of claim 12, wherein the select circuit is configured to respond to the second information received at the pin to select a selected foldback correction curve from multiple foldback correction curves based on the information received at the pin to control a power level of the apparatus based on the selected foldback correction curve.

15. The apparatus of claim 12, wherein the pin is to detect a third information during the first detection period to enable the control circuit to perform an over-voltage protection function based on the third information.

16. The apparatus of claim 12, wherein pin is configured to detect the second information during a startup mode.

17. An electrical system comprising:
a display;
a transformer coupled to the display;
a peripheral circuit coupled to the transformer, the peripheral circuit including resistors that form a voltage divider; and
an integrated circuit coupled to the transformer and the peripheral circuit, the integrated circuit including:
a pin to receive information, the pin coupled to the resistors such that a value of the information received at the pin is based on values of the resistors;
a select circuit responsive to the information received at the pin to select a selected burst switching frequency from multiple selectable burst switching frequencies based on a value of the information received at the pin, wherein the select circuit includes a generator to generate a plurality of first selectable signals having frequencies corresponding to the multiple selectable frequencies, a comparator to compare the information received at the pin with a first voltage to produce a comparison result, and an election unit responsive to the comparison result to select one of the first selectable signals to be a selected signal, and wherein the selected burst switching frequency corresponds to the frequency of the selected signal;

a drive circuit to provide a signal to switch a transistor to transfer power from an input node to an output node during a normal mode and a burst mode; and a control circuit coupled to the select circuit and the drive circuit to enable the drive circuit to switch the transistor switch at the selected burst switching frequency during the burst mode.

18. The system of claim 17, wherein the select circuit is configured to select a selected foldback correction curve from multiple foldback correction curves based on the information received at the pin to control a maximum power level of the apparatus based on the selected foldback correction curve.

19. The system of claim 17, wherein the transistor includes a first terminal to receive the signal from the select circuit, a second terminal coupled to a first voltage, and a third terminal coupled to a second voltage, and wherein the pin is configured to detect a zero crossing of a signal at the second terminal of the transistor when the transistor is turned off in the normal mode.

20. The system of claim 17, wherein the control circuit is configured to perform an over-voltage protection function based on the information received at the pin when the transistor is turned on in the normal mode.

21. The system of claim 17, wherein the peripheral circuit includes:
a diode and a first resistor coupled in series between the pin and the transformer; and
a second resistor coupled between the pin and ground.

22. The system of claim 21, wherein the peripheral circuit further includes a third resistor coupled between the pin and a gate of the transistor.

23. An electrical system comprising:
a display;
a transformer coupled to the display;
a peripheral circuit coupled to the transformer; and
an integrated circuit coupled to the transformer and the peripheral circuit, the integrated circuit including:
a select circuit responsive to the information received at a pin to select a selected burst switching frequency from multiple selectable burst switching frequencies, wherein the select circuit includes:
a comparison unit to compare the information at the pin with at least one voltage to provide a comparison result;
a first generator to generate a plurality of first selectable signals having frequencies corresponding to the multiple selectable frequencies;
a second generator to generate a plurality of second selectable signals having values corresponding to the plurality of foldback correction curves; and
an election unit responsive to the comparison result to select one of the first selectable signals to be a first selected signal, and to select one of the second selectable signals to be a second selected signal, wherein the selected burst switching frequency corresponds to the frequency of the selected signal, and wherein a value of the second selected signal corresponds to the selected foldback correction curve; and
a drive circuit to provide a signal to switch a transistor to transfer power from an input node to an output node during a normal mode and a burst mode; and
a control circuit coupled to the select circuit and the drive circuit to enable the drive circuit to switch the transistor switch at the selected burst switching frequency during the burst mode.

24. A method comprising:
receiving information at a pin of an integrated circuit, wherein the pin is coupled to resistors that form a voltage divider, and a value the information received at the pin is based on values of the resistors;
selecting a selected burst switching frequency from multiple selectable burst switching frequencies based on a value of the information received at the pin;
generating a plurality of first selectable signals having frequencies corresponding to the multiple selectable frequencies;
comparing the information received at the pin with a first voltage to produce a comparison result;
selecting one of the first selectable signals to be a selected signal in response to the comparison result, and wherein the selected burst switching frequency corresponds to the frequency of the selected signal; and
switching a switch to transfer power from an input node to an output node during a normal mode and a burst mode, wherein the switch is switched at the selected burst switching frequency during the burst mode.

25. The method of claim 24 further comprising:
selecting a selected foldback correction curve from multiple foldback correction curves based on the information received at the pin.

26. The method of claim 25 further comprising:
detecting a zero crossing of the signal at a terminal of the switch based on the information received at the pin.

27. The method of claim 26 further comprising:
performing an over-voltage protection function based on the information received at the pin.

28. The method of claim 24, wherein the information received at the pin is created by sourcing a signal within the integrated circuit to the pin during a detection period.

29. The method of claim 24, wherein the information received at the pin is created by providing a voltage through a resistor network coupled to the pin, wherein the resistor network is outside the integrated circuit.

* * * * *

UNITED STATES PATENT AND TRADEMARK OFFICE
CERTIFICATE OF CORRECTION

PATENT NO. : 7,667,526 B2
APPLICATION NO. : 11/461303
DATED : February 23, 2010
INVENTOR(S) : Chan et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 232 days.

Signed and Sealed this

Twenty-eighth Day of December, 2010

David J. Kappos
*Director of the United States Patent and Trademark Office*